US009214335B2

(12) United States Patent
Bruce et al.

(10) Patent No.: US 9,214,335 B2
(45) Date of Patent: Dec. 15, 2015

(54) SURFACE PLASMA MODIFICATION OF POROUS THIN-FILMS TO OPTIMIZE PORE FILLING

(71) Applicant: International Business Machines Corporation, Armonk, NY (US)

(72) Inventors: Robert L. Bruce, White Plains, NY (US); Geraud J. Dubois, Los Altos, CA (US); Theo J. Frot, San Francisco, CA (US); Krystelle Lionti, Campbell, CA (US); Teddie P. Magbitang, San Jose, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 14/261,357

(22) Filed: Apr. 24, 2014

(65) Prior Publication Data

US 2015/0311066 A1    Oct. 29, 2015

(51) Int. Cl.
*H01L 21/324* (2006.01)
*H01L 21/02* (2006.01)
*H01L 21/311* (2006.01)

(52) U.S. Cl.
CPC .... *H01L 21/02315* (2013.01); *H01L 21/02203* (2013.01); *H01L 21/31116* (2013.01); *H01L 21/31127* (2013.01); *H01L 21/324* (2013.01)

(58) Field of Classification Search
None
See application file for complete search history.

(56) References Cited

U.S. PATENT DOCUMENTS

| | | | |
|---|---|---|---|
| 6,537,896 B1 * | 3/2003 | Catabay et al. | 438/474 |
| 7,015,150 B2 | 3/2006 | Cooney, III et al. | |
| 7,335,586 B2 | 2/2008 | RamachandraRao et al. | |
| 7,442,756 B2 | 10/2008 | Heiliger et al. | |
| 7,781,254 B2 | 8/2010 | Brabec et al. | |
| 7,951,413 B2 | 5/2011 | El-Nounou et al. | |
| 8,187,678 B2 | 5/2012 | Jiang et al. | |
| 8,314,005 B2 | 11/2012 | Purushothaman et al. | |
| 8,361,553 B2 | 1/2013 | Karandikar et al. | |
| 8,492,239 B2 | 7/2013 | Bruce et al. | |
| 8,541,301 B2 | 9/2013 | Dubois et al. | |
| 8,623,741 B2 | 1/2014 | Purushothaman et al. | |
| 8,932,934 B2 * | 1/2015 | Chae et al. | 438/422 |
| 9,058,983 B2 * | 6/2015 | Dubois et al. | 1/1 |
| 2004/0198068 A1 | 10/2004 | Yoshie | |
| 2006/0113675 A1 * | 6/2006 | Chang et al. | 257/763 |
| 2008/0230773 A1 | 9/2008 | Dickey et al. | |

(Continued)

FOREIGN PATENT DOCUMENTS

JP     2003064207 A     3/2003

OTHER PUBLICATIONS

"Method for pore sealing by selective polymer growth on mixed substrates," IP.com, IPCOM000030172D, Jul. 30, 2004, 3 pp.

(Continued)

*Primary Examiner* — Anita Alanko
(74) *Attorney, Agent, or Firm* — Shumaker & Sieffert, P.A.

(57) ABSTRACT

The present invention describes a process to modify a top portion of a porous ultra low-k (ULK) material in order to maximize porosity filling with a filling material that initially displayed low compatibility with the ULK material. Surface modification is achieved by a plasma treatment, enhancing the compatibility between the ULK surface and the filling material. The invention obtains high filling levels with minimum modification to the ULK material, as only a thin top portion is modified without significant pore sealing.

20 Claims, 19 Drawing Sheets

(56) References Cited

U.S. PATENT DOCUMENTS

2010/0006957 A1\* 1/2010 Verheijden et al. ........... 257/415
2013/0017688 A1 1/2013 Dubois et al.
2014/0367356 A1\* 12/2014 Dubois et al. .................. 216/12

OTHER PUBLICATIONS

Bao et al., "Mechanistic study of plasma damage of low k dielectric surfaces," J. Vac. Sci. Technol. B, vol. 26, No. 1, American Vacuum Society, Jan.-Feb. 2008, 8 pp.

Borcia et al., "Surface Treatment of Polymers by Plasma and UV Radiation," Rom. Journ. Phys., vol. 56, No. 1-2, Bucharest, 2011, 9 pp.

Cho et al., "Modification of Nanoporous Silica Structures by Fluorocarbon Plasma Treatment," Mat. Res. Soc. Symp. Proc., vol. 812, Materials Research Society, 2004, 6 pp.

Egitto, "Plasma etching and modification of organic polymers," Pure and Appl. Chem, vol. 62, No. 9, IUPAC, 1990, 10 pp.

Favia et al., "Grafting of Chemical Groups onto Polymers by Means of RF Plasma Treatments: a Technology for Biomedical Applications," J. Phys IV France 7, 1997, 10 pp.

Frot et al., "Post Porosity Plasma Protection: Scaling of Efficiency with Porosity," Advanced Functional Materials, vol. 22, No. 14, 2012, 8 pp.

Peng et al., "Pore Sealing by NH3 Plasma Treatment of Porous Low Dielectric Constant Films," Journal of The Electrochemical Society, vol. 154, No. 4, 2007, 10 pp.

Volksen et al., "Hybrid dielectric constant thin films for microelectronics," Scripta Mater., retrieved from http://dx.doi.org/10.1016/j.scriptamat.2013.05.025, 2013, 6 pp.

\* cited by examiner

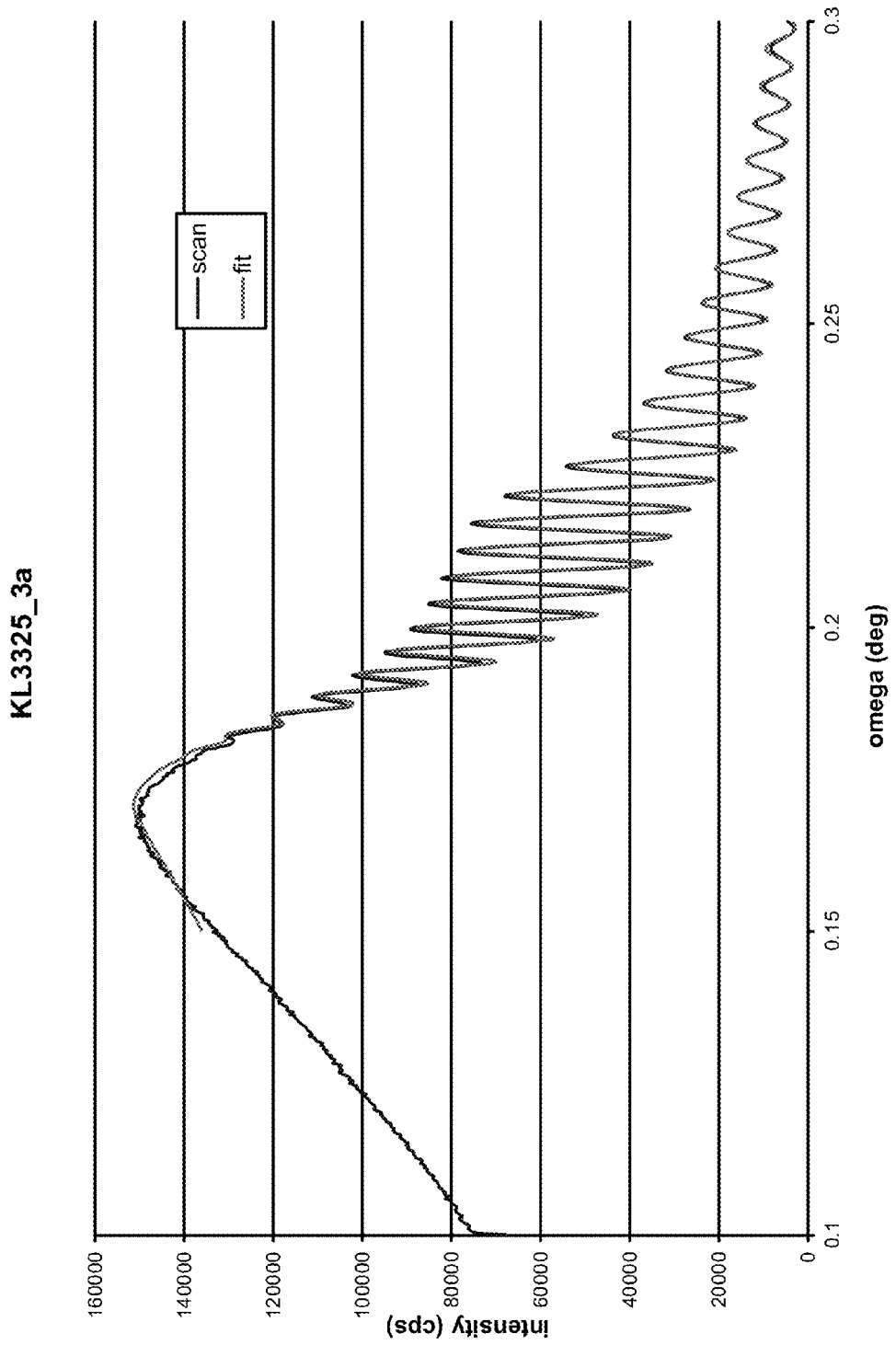

SURFACE PLASMA MODIFICATION OF POROUS THIN-FILMS TO OPTIMIZE PORE FILLING

TECHNICAL FIELD

The exemplary embodiments of this invention relate generally to semiconductor devices and, more specifically, to porous dielectric materials.

BACKGROUND

The semiconductor industry continues to present a need for the development of new, low dielectric constant (k) materials to foster improved microprocessor performance. In particular, there is a strong drive to reduce the dielectric constant of interlayer dielectric (ILD) materials, such as those existing between metal lines. It has been recognized that the speed of propagation of interconnect signals significantly impacts overall circuit speed in microprocessors, particularly as feature sizes are reduced and the number of devices per unit area is increased. With the reduced size of microprocessor features, interconnect signals may travel faster through conductors due to a concomitant reduction in resistance-capacitance (RC) delays. The approach of introducing porosity to dielectric materials to decrease their k has been adopted to provide a pathway for generational extendibility. Porous ultra low-k (ULK) dielectrics have enabled capacitance reduction in advanced silicon complementary metal-oxide semiconductor (CMOS) back end of line (BEOL) structures. However, while increasing porosity may lower the dielectric constant, other properties of dielectric materials—such as ULK stiffness, fracture resistance, and interfacial adhesion—can be negatively impacted due to a decrease in density and network-connectivity. Likewise, while high levels of porosity may assist in achieving, for example, k values of 2.4 or lower, such porosity can also result in dielectric material damage or loss during plasma exposures (such as reactive ion etch (RIE), strip, or dielectric barrier etch) and wet cleans (such as post-RIE dilute hydrofluoric acid (DHF) cleans).

SUMMARY

In general, the invention relates to semiconductor devices and, more specifically, to an ultra-low k, porous dielectric film disposed on a substrate and modified by a plasma to enhance compatibility and wettability between a filling material and a porous ULK surface, to enhance pore filling with a filling material such as a polymer.

In one exemplary method, the disclosure includes providing a structure comprising a first layer and a substrate, wherein the first layer overlies the substrate and includes a dielectric material comprising a plurality of pores, using a plasma to modify a top portion of the first layer to form a modified top portion of the first layer, wherein the modified top portion has a thickness in the range of about 5 to about 20 nanometers (nm), and wherein the plurality of pores in the first layer remains substantially unsealed after the plasma modification. This exemplary method further includes applying a filling material to the modified top portion of the first layer, wherein the filling material comprises a polymer, and after applying the filling material, heating at least one of the plasma-treated structure or the filling material to enable the filling material to at least partially fill all or substantially all of the plurality of pores disposed throughout the first layer, wherein upon heating said at least one of the plasma-treated structure or filling material a residual amount of the filling material remains disposed over all of a top surface of the modified top portion of the first layer. In some examples, further processing of the structure includes removing the residual amount of the filling material, depositing a hardmask layer on the top surface of the modified top portion of the first layer, and applying a photoresist layer on the hardmask layer and patterning the photoresist layer, wherein one or more openings in the patterned photoresist layer expose a portion of the hardmask layer. Additional processing or integration steps in such an exemplary method may also include etching at least part of the exposed portion of the hardmask layer and the first layer underlying the exposed portion of the hardmask layer to form one or more etched openings in the hardmask and first layers, removing a remainder of the photoresist layer to expose a remainder of the hardmask layer, depositing a liner material on at least some of the remainder of the hardmask layer and in the one or more etched openings in the hardmask and first layers to form a liner layer, filling the one or more etched openings with a metal, wherein the metal overfills the one or more etched openings and is disposed on at least some of the liner layer over the remainder of the hardmask layer, and planarizing at least some of the metal, the liner layer over the remainder of the hardmask layer, and the remainder of the hardmask layer to expose at least some of the top surface of the modified top portion of the first layer. Such an exemplary method further can include removing the filling material from the plurality of pores, and depositing a cap layer of an insulating material on at least the top surface of the modified top portion of the first layer, wherein the first layer comprises a porous ultra low-k (ULK) material.

The disclosure also includes an exemplary method of using a plasma to modify a top portion of a first layer of a structure to form a modified top portion, wherein the first layer includes a dielectric material comprising a plurality of pores, the plurality of pores remaining substantially unsealed after the plasma modification, the modified top portion of the first layer having a thickness in the range of about 5 to about 20 nm, and wherein the structure comprises the first layer and a substrate, the first layer overlying the substrate. This exemplary method further includes applying a filling material to the modified top portion of the first layer, the filling material comprising a polymer, and after applying the filling material, heating at least one of the plasma-treated structure and the filling material to enable the filling material to fill at least 50% of the volumetric porosity defined by the plurality of pores of the first layer, wherein upon heating said at least one of the plasma-treated structure and the filling material a residual amount of the filling material remains disposed over all of a top surface of the modified top portion of the first layer.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIGS. 9A to 9L are charts illustrating x-ray reflectivity scans of sample structures.

DETAILED DESCRIPTION

Figure 1:
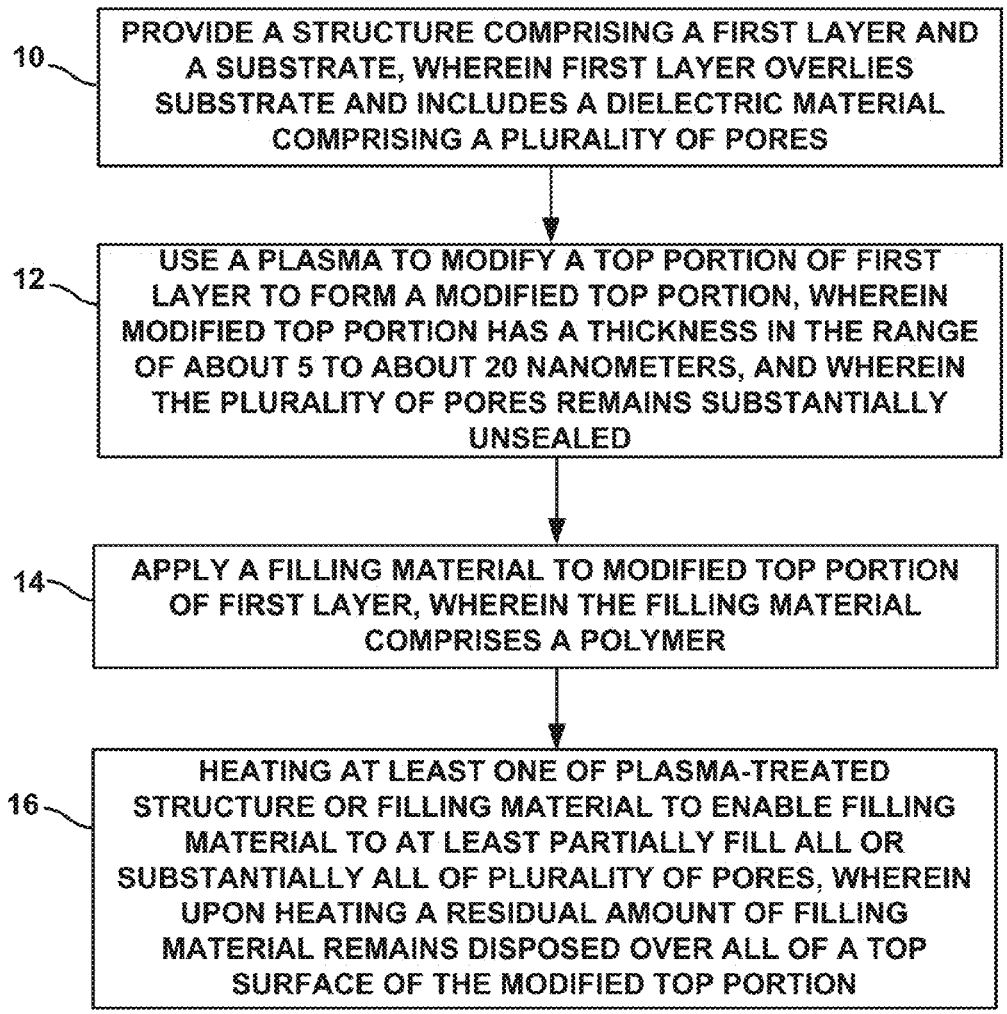
FIG. 1 is a flow diagram illustrating an exemplary technique for using a plasma to modify a first layer of a structure having a plurality of pores and for filling the pores.

The present disclosure describes a structure having a first layer including a porous dielectric material overlying a substrate, and techniques for modifying porous dielectric material using a plasma to achieve high levels of homogeneous and uniform filling of the pores with a filling material. For example, the disclosure describes a semiconductor wafer having a porous ULK (or low k) dielectric thin-film overlying a substrate, and a method of altering the surface chemistry of the ULK thin-film and enhancing compatibility between the film and a filling material, by modifying a top portion of the film using a plasma (such as ionized gas), without sealing the pores of the film. In particular, spin-on ULK dielectrics (e.g., organosilicates) falling in the microporous and mesoporous regime, e.g., k values ranging from 2.4 to 1.8, have been analyzed. Subsequent homogenous filling of the pores of the ULK with a filling material (such as an organic polymer) via the plasma-modified top portion of the dielectric thin-film layer of the structure can lend, among other things, increased mechanical strength to the structure during subsequent integration processing steps. In the absence of filling of the pores of the ULK thin-films, integration processes (including but not limited to additional plasma exposures) may cause damage to the porous thin-films. The disclosure further provides for, among other things, removal of the referenced filling material from the plurality of pores of the first layer following completion of certain integration steps, restoring the low (or ultra low) dielectric constant of the porous dielectric material.

Modern semiconductor manufacturing processes also may introduce additional considerations when using porous ULK dielectric materials. For example, damage to such materials can occur at different stages of the integration process, including but not limited to, during hard-mask deposition, reactive ion etch, photoresist strip, liner deposition, chemical mechanical polishing, or cap deposition. With respect to integration, decreasing both the size of device features and certain mechanical properties (as noted) may lead to processing issues for ULK materials whose k≤2.7. In particular, the high accessible surface area of the ULK materials due to high porosity may render the ULK materials sensitive to plasma processes, and damage to the ULK can manifest itself in several areas. One way to address such issues is to redesign the ULK materials. For example, plasma damage can be mitigated by increasing the ULK carbon content and/or by decreasing pore size and connectivity (at a given k). Plasma damage may also be repaired once it has occurred. However, those approaches present limitations, and may be successful only for certain values of k, for example, for k values of 2.55 or higher.

Moreover, when a dielectric material possesses a high degree of porosity and pore connectivity, metals used in liner layers (e.g., Ta, TaN) or seed layers (e.g., Cu, Ru) may penetrate the pores within the dielectric layer or film. Such metal penetration can cause degradation of the dielectric, reduced strength, and degradation of leakage characteristics of the dielectric. Such issues collectively may cause degradation of performance and reliability in BEOL structures made with highly porous ULK dielectrics. Use of a plasma to modify a top portion of a first layer (e.g., a film of dielectric material) of the disclosed structure occurs after porosity has been created in the first layer and after the first layer including a dielectric material has reached its maximum shrinkage under curing deposition conditions. Before any subsequent integration steps, a filling material, such as a thermally labile organic material in solution, may be spin-coated on a top surface of the first layer (e.g., the top surface of a porous ULK material). Subsequent thermal treatment may allow the filling material to penetrate a plurality of pores disposed throughout the first layer of the structure. In this manner, the ULK material undergoes little or no damage during integration, since the integration processes are carried out on a non-porous, high carbon content material. The filling material (or sacrificial agent) can then be burned out after integration, restoring the dielectric constant of the ULK material to at or near its initial value. Contrary to other known methods, the disclosed approach benefits from achieving desirably low k values of ULK materials (i.e., those with high porosity) because more polymer may be introduced into the porosity of the materials, leading to better protection of the ULK.

Filling materials to be used in the disclosed technique may preferably include certain properties, for example, a molecular weight that is compatible with the pore size of the ULK material, in order to facilitate penetration of the filling material into the pores. Further, following application (for example, spin-coating of the filling material), the filling material may display a low melt viscosity when heated to allow pore filling by capillary action. The filler also preferably maintains its stability during thermal excursions up to 300° C. during integration, yet decomposes at a temperature between 300° C. and 400° C. under back end of line (BEOL) conditions. Further, favorable compatibility between the filling material and the surface chemistry of the ULK material is desirable for use of the disclosed techniques. When such compatibility is low, dewetting can occur during spin-coating of the filling material, resulting in undesirable inhomogeneous and reduced filling of pores of the first layer of the disclosed structure. Such dewetting may be commonly encountered when utilizing ULK materials, which tend to display a high surface energy. In addition to one or more polymers, filling materials may further include solvents and/or surfactants, as further noted in examples herein.

The disclosed techniques include using a plasma (for example, ionized argon, ammonia, carbon monoxide, or oxygen gas, or combinations thereof) to modify a top portion of the first layer to form a modified top portion of the first layer, with the modified top portion having a thickness in the range of about 5 to about 20 nanometers (nm). Using a plasma to modify (or damage) the first layer to a thickness in this range enabled very high levels of filling of pores with filling materials that initially presented low surface chemistry compatibility with selected ULK materials (e.g., dewetting and inhomogeneous filling)—for example, after modifying the first layer with a plasma and heating the structure, the filling material, or both the structure and filling material, filling of greater than 80% of the volumetric porosity throughout a ULK dielectric was achieved, and in some cases greater than 95% filling was observed. Optimization of the power and time of treatment (for example, a power of about 200 watts for about five seconds) of the first layer with the plasma allows for the plurality of pores in the first layer to remain substantially unsealed (for example, nearly unsealed or entirely unsealed) after the plasma modification, leading to desired filling levels.

As noted, the filling material (e.g., a polymer) may be applied to the structure by any number of methods, such as spin-coating. After applying the filling material, the plasma-treated structure, the filling material, or both the structure and filling material, may be heated to enable the filling material to at least partially fill all or substantially all of the plurality of pores disposed throughout the first layer. A sufficient amount of filling material may be applied so that when heated, a residual amount of filling material remains uniformly disposed over all of a top surface of the modified top portion of the first layer. Applying this step can contribute, for example, to a reduction or elimination of dewetting and inhomogeneous filling of pores at or near the top surface of the first layer (e.g., the ULK thin-film) of the structure.

In performing the disclosed techniques, upon heating at least one of the plasma-treated structure or filling material to enable the filling material to at least partially fill all or substantially all of the plurality of pores disposed throughout the first layer, a portion of the first layer underlying the modified top portion (i.e., underlying the ULK material having a thickness between about 5 and about 20 nm after being treated with plasma) and having pores at least partially filled with the filling material may have a density between about 1.30 g/cm$^3$ and about 1.40 g/cm$^3$.

In some examples, after heating of the plasma-treated structure and/or filling material, and filling of the plurality of pores of the first layer of the structure, the disclosed technique also includes removing the residual amount of the filling material disposed over the top surface of the modified top portion of the first layer. Further, in some examples after the heating and filling of pores with filling material, at least one process may be performed on the structure, for example integration processes performed in the production and/or assembly of semiconductors and/or microprocessors. The disclosed techniques also may include after performing at least one process on the structure, performing a DHF soak on the structure to dissolve at least some of the modified top portion of the first layer.

The disclosed techniques also may optionally include, after performing at least one process on the structure, removing the filling material from the plurality of pores of the first layer by heating at least one of the structure or filling material to decompose the filling material (for example, heating at a temperature of about 400° C. for about 15 minutes), returning the dielectric constant of the ULK material to at or near its initial value before filling of its pores with filling material. The first layer (e.g., ULK dielectric material) at this stage of the disclosed technique (after removal of the filling material) may have, for example, a density between about 0.950 g/cm$^3$ and about 1.00 g/cm$^3$.

Also disclosed herein is an exemplary method of using a plasma to modify a top portion of a first layer of a structure to form a modified top portion, where the first layer includes a dielectric material comprising a plurality of pores, the plurality of pores remaining substantially unsealed after the plasma modification, the modified top portion of the first layer having a thickness in the range of about 5 to about 20 nanometers (nm), and the structure includes the first layer and a substrate, the first layer overlying the substrate. The method also includes application of the filling material to the modified top portion of the first layer and, after applying the filling material, heating the plasma-treated structure, the filling material (or both) to enable the filling material to fill at least 50% (e.g., at least 80%) of the volumetric porosity defined by the plurality of pores of the first layer. Upon heating at least the plasma-treated structure or filling material, a residual amount of filling material remains disposed over all of the top surface of the modified top portion of the first layer.

Figure 2:
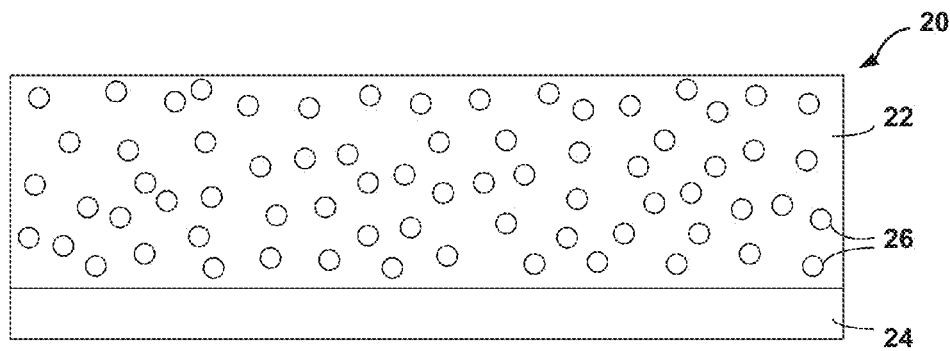
FIG. 2 is a lateral cross-sectional view of an exemplary structure prior to modification of a first layer of the structure by a plasma, according to the example technique of FIG. 1.

FIG. 1 is a flow diagram illustrating an exemplary technique for using a plasma to modify a first layer of a structure having a plurality of pores and for filling the pores. In describing the exemplary technique of FIG. 1, reference may be made to FIGS. 2, 3, 6 and 7 set forth herein. It should be understood that features of certain Figures of this disclosure may not necessarily be drawn to scale, and that the Figures present non-exclusive examples of the techniques disclosed herein. In the method of FIG. 1, a structure 20 is provided that includes a first layer 22 and a substrate 24, wherein first layer 22 overlies substrate 24 and includes a dielectric material having a plurality of pores 26 (10), as shown at FIG. 2. FIG. 2 is a lateral cross-sectional view of an exemplary structure 20, for example a semiconductor wafer or interconnect structure, prior to modification of first layer 22 by a plasma. The dielectric material of first layer 22 may include a ULK or low-k material. The technique of FIG. 1 takes place after the plurality of pores 26 have been formed in first layer 22, and preferably after the dielectric material of first layer 22 has reached its maximum shrinkage under curing deposition conditions.

Various examples of the invention relate to techniques for fabrication of a structure 20 that can be employed in a microelectronic device, such as high speed microprocessors, application specific integrated circuits (ASICs), or memory devices, as non-limiting examples. An exemplary structure 20 may include at least one conductive feature, formed on substrate 24, with substrate 24 further including at least one insulating layer surrounding the at least one conductive feature. For example, the at least one insulating layer may surround the at least one conductive feature at its bottom and lateral surfaces. The exemplary structure 20 further may include at least one conductive barrier layer disposed for at least one interface between the at least one insulating layer and the at least one conductive feature. In some examples, the combination of the at least one conductive feature and the at least one insulating layer may be repeated to form a multilevel interconnect stack. The exemplary substrate 24 may include, for example, a silicon wafer that contains microelectronic devices, a ceramic chip carrier, an organic chip carrier, a glass substrate, a GaAs, SiC or other semiconductor wafer, a circuit board or a plastic substrate, as additional non-limiting examples.

Figure 3:
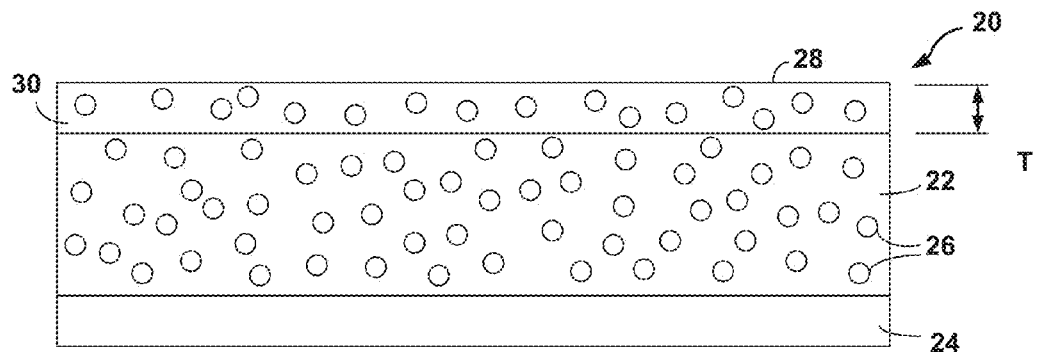
FIG. 3 is a lateral cross-sectional view of an exemplary structure subsequent to modification of a top portion of the first layer of the structure by a plasma, according to the exemplary technique of FIG. 1.

The technique of FIG. 1 further includes using a plasma to modify a top portion of first layer 22 to form a modified top portion 30 of first layer 22 that has a thickness "T" (as shown at FIG. 3), where T is in the range of about 5 to about 20 nanometers (nm). The technique of FIG. 1 further provides that plurality of pores 26 remains substantially unsealed (12)

Figure 4:
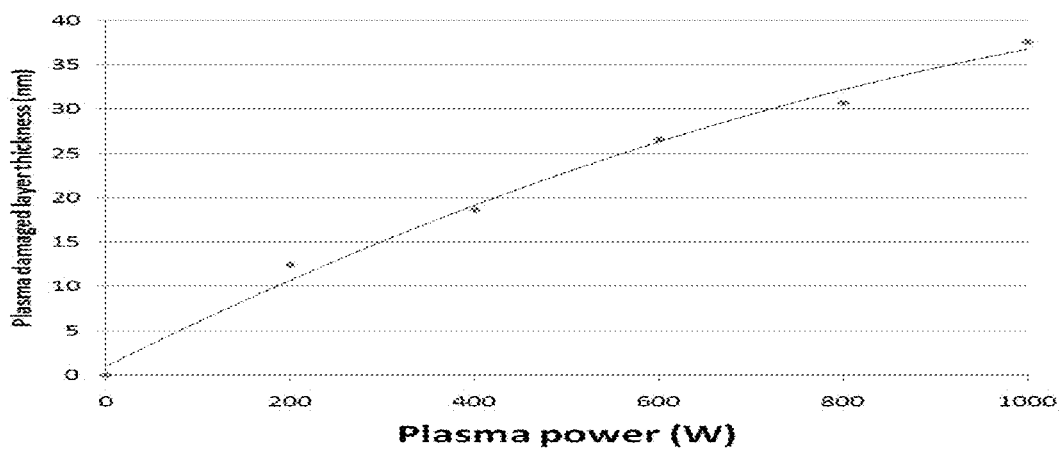
FIG. 4 is a chart illustrating a curve defined by the thickness of a modified portion of a first layer of a structure as a function of plasma power.

(for example, nearly unsealed or entirely unsealed) after treatment with the plasma to form modified top portion 30. FIG. 3 is a lateral cross-sectional view of exemplary structure 20 subsequent to modification of a top portion of first layer 20 by a plasma. The disclosed method of FIG. 1 modifies between 5 and 20 nm of a top portion of the dielectric material of first layer 22 in a controlled way using the plasma treatment. Depending upon the plasma conditions, the thickness of the modified portion of first layer 22 varies, as illustrated by the chart at FIG. 4. FIG. 4 is a chart illustrating curves defined by the thickness T of modified top portion 30 of first layer 22 of structure 20 as a function of plasma power. FIG. 4 shows the thickness T of a plasma-damaged ULK measured in nanometers—determined by x-ray reflectivity (XRR)—as a function of plasma power measured in watts. In creating the data points of the chart at FIG. 4, an $O_2$ ash was employed for 5 seconds on a spin-on ULK material having a k value of 2.2. As shown in the chart, as the plasma power increases, the damaged layer thickness increases as well. The chart shows further that a plasma power of between about 100 watts and about 400 watts produces a plasma-damaged layer thickness of between about 5 nm and 20 nm. The ULK surface energy also significantly decreases upon plasma modification, as evidenced by a drop in contact angle of water on the ULK surface from more than 90° to less than 50°, and in some examples less than 30°, after plasma treatment.

Figure 6:
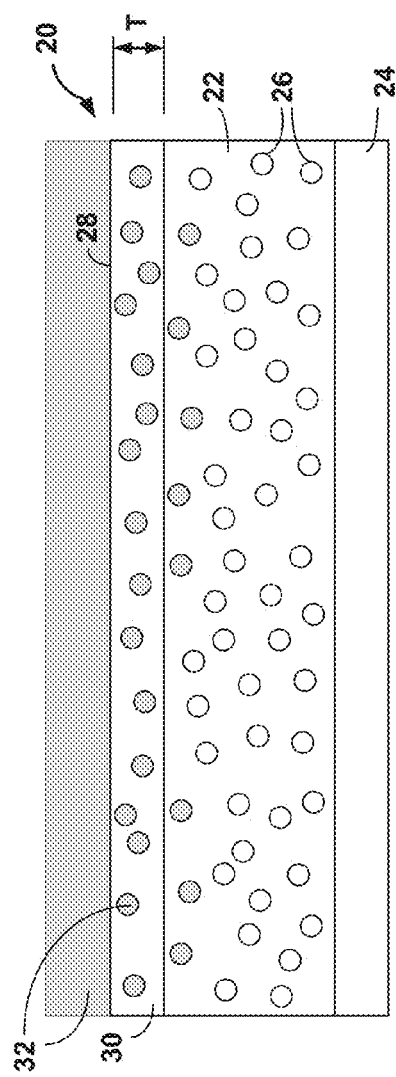
FIG. 6 is a lateral cross-sectional view of an exemplary structure after application of a filling material to the modified top portion of the first layer but prior to heating, according to the exemplary technique of FIG. 1.

Once first layer 22 has been treated with a plasma in the described manner, dewetting at a top surface 28 of modified top portion 30 of first layer 22 may be limited or eliminated when the pores of first layer 22 are filled with a filling material 32, such as a polymer (see FIG. 6). Modification of a dielectric thin-film with a plasma can lead to better compatibility between filling material 32 and a top surface 28 of the dielectric material. As a result, homogeneous and high filling levels of the volumetric porosity of ULK materials may be achieved. In carrying out the techniques of this disclosure, including that of FIG. 1, it is desirable to select a filling material (for example, a thermally labile organic material or polymer) with a molecular weight that is compatible with the pore size of the dielectric material of first layer 22, in order to facilitate penetration of the filling material into the pores of the dielectric material. Further, filling material 32 preferably may display a low melt viscosity during post-application heating to allow pore filling by capillary action. Filling material 32 also is preferably able to survive thermal excursions up to about 300° C. to ensure its stability during potential subsequent integration processes, while still being decomposable between about 300° C. and about 400° C. under BEOL-compatible integration conditions. In addition, as noted above, favorable compatibility between filling material 32 and the surface chemistry of the dielectric material (for example, a ULK) of first layer 22 enhances the successfulness of the filling process. In some examples, in addition to including a polymer, filling material 32 may further include a suitable solvent (for example, a common organic solvent) and/or a surfactant.

When such compatibility between a filling material and the surface chemistry of a ULK material is low, dewetting may occur during spin-coating of filling material 32 (or a solution of filling material 32) and result in low or no filling of plurality of pores 26 of first layer 22. Such dewetting is commonly encountered with ULK materials displaying high surface energies. Dewetting of this nature may occur with dielectric materials deposited on a substrate by both spin-on and PECVD methods, as shown at Table 1.

TABLE 1

| Deposition method | K | Porosity | Average pore size diameter (nm) | Density (g/cm³) | Refractive Index | Filling Material | Filling level of dewetted areas | Filling level of wetted areas |
|---|---|---|---|---|---|---|---|---|
| PECVD 1 | 2.4 | 18.8% | 1.3-1.5 | 1.19 | 1.3668 | 15-S-15 @ 25 wt % in mesitylene | 0% | 29% |
|  |  |  |  |  |  | 15-S-15 @ 25 wt % in PnP-OH | 0% | 24% |
| PECVD 2 | 2.4 | 18.7% | 1.3-1.5 | 1.18 | 1.4288 | 15-S-15 @ 25 wt % in PGMEA | 0% | 21% |
| Spin-on 1 | 2.4 | 20.4% | 1.3-1.5 | 1.19 | 1.3705 | 15-S-15 @ 25 wt % in PnP-OH | 0% | 41% |
| Spin-on 1 | 2.2 | 27.5% | 1.5-1.8 | 1.09 | 1.3340 | 4.1k PPG @ 20 wt % in PGMEA | 0% | 32% |
| Spin-on 3 | 2.0 | 39.6% | 1.8-2 | 0.90 | 1.2732 | 1.5k PPG @ 20 wt % in PGMEA | 0% | 4% |

Table 1 shows (among other things) filling levels of dewetted and wetted areas of certain ULK materials, namely, the percent filling of the volumetric porosity of certain ULK materials with particular filling materials in dewetted and wetted areas of the ULK materials. The ULK materials presented in Table 1 display low compatibility with the filling materials. In generating the results of Table 1, PECVD and spin-on ULK materials with varying porosity and chemical composition were filled with different filling materials using the techniques disclosed herein. The selected filling materials possessed properties satisfying certain conditions referenced above, such as a molecular weight compatible with the pore size of the dielectric material, a low melt viscosity during post-application heating, ability to survive thermal excursions up to about 300° C., and decomposability between about 300° C. and about 400° C. In Table 1, PECVD 1, PECVD 2 and spin-on 1 have the same dielectric constant but different chemical compositions, while spin-on films 1, 2, and 3 have the same chemical composition but display different dielectric constants. Irrespective of the ULK physical properties, dewetting always was observed on spin-apply, leading to areas of porosity of the dielectric materials which were either partially filled or unfilled. For partially filled areas, a maximum filling level of about 41% was obtained. The low filling level and the nonhomogeneous filling across the example wafers of Table 1 demonstrate limitations in working with materials not modified according to certain aspects of this disclosure.

Table 1 also presents data for different dielectric thin-films, including but not limited to, their respective dielectric constants (k values), their volumetric porosities, average pore size diameters in nm, their densities in g/cm³, and refractive indices ((RI), measured using spectro-reflectometry). Further shown in Table 1, as noted, is the identification of the composition of the filling materials applied to the respective porous dielectric materials. For example, solutions of 25 weight percent (wt. %) Tergitol™ 15-S-15 (manufactured by The Dow Chemical Company) were separately prepared in mesitylene, in propylene glycol n-propyl ether (PnP-OH), and in propylene glycol monomethyl ether acetate (PGMEA). A solution of 20 wt. % polypropylene glycol (PPG) (weight average molecular weight (Mw)=4,100 daltons) in PGMEA was tested, as was a solution of 20 wt. % PPG (Mw=1,500 daltons) in PGMEA. The respective filling levels of the volumetric porosities of the dielectric thin-films with the respective filling materials, in dewetted and wetted areas, are further presented.

Figure 5:
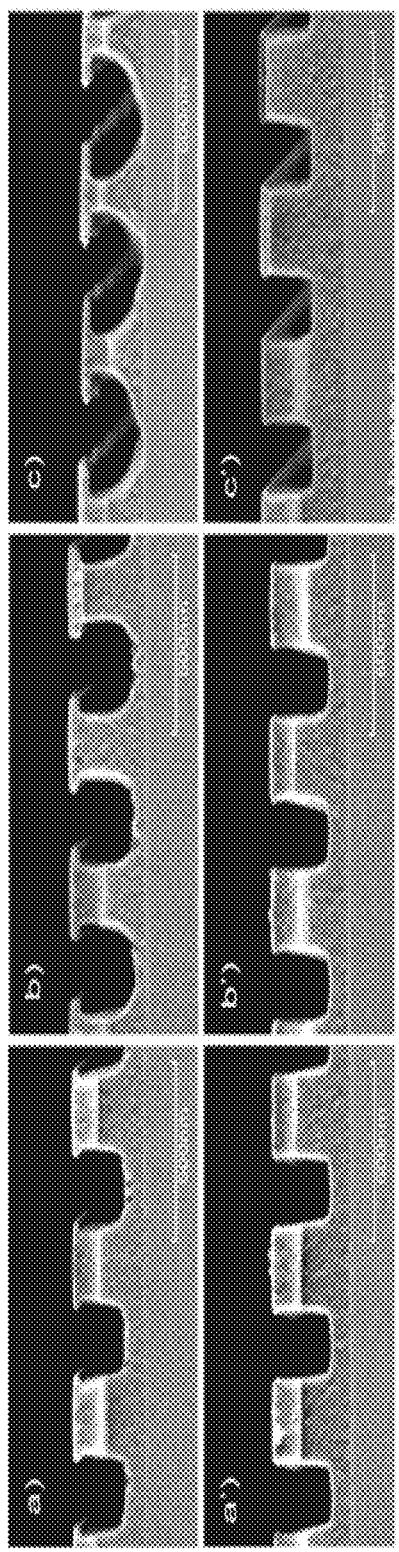
FIG. 5 shows electron microscope cross-sections of trenches of filled and unfilled porous ULK materials that have undergone integration processing steps.

FIG. 5 of this disclosure shows electron microscope cross-sections of trenches of exemplary filled and unfilled porous ULK materials that have undergone integration processing steps. As shown in FIG. 5, trench-only single damascene structures were fabricated on 200 mm wafers using a process sequence that limited post-film fill processing steps to a temperature less than 300° C. In particular, the pictures of FIG. 5 show filled porous ULK materials (i.e., protected materials), as compared to pristine, unfilled porous ULK materials (i.e., unprotected), all of which were characterized after exposition to an aggressive ash chemistry ($O_2$ strip) followed by a DHF soak. Pictures a), b), and c) of FIG. 5 show an unprotected ULK material having k values of 2.2, 2.0, and 1.8, respectively, whereas, photos a'), b'), and c') show a protected ULK material having k values of 2.2, 2.0, and 1.8, respectively. The pores of the ULK material of pictures a'), b'), and c') were filled and protected by PMA-1.1, PMA-4.7 and PMA-10, respectively. The proprietary methacrylate based copolymers (PMA) used in the example of FIG. 5 had thermal properties compatible with integration processes (e.g., stable up to 300° C. in an inert atmosphere and compatible with BEOL conditions), in that they completely decompose under BEOL conditions. The PMA copolymers are identified by their molecular weight (for example, PMA-1.1 is a PMA copolymer with a molecular weight of 1,100 daltons). A side-by-side comparison of ULK-2.2, ULK-2.0 and ULK-1.8 unprotected or protected by the PMA-1.1, PMA-4.7 and PMA-10, respectively, was performed by cross-sectional scanning electron microscopy (XSEM). The profiles after a dielectric etch, strip, cap open and DHF dip are illustrated at FIG. 5. The DHF step was used to remove a silica-like hydrophilic damage layer on the trench sides and bottom. No further integration could have been pursued on the trench profiles of the unprotected ULKs due to their low quality. The bottom of the line was pitted and microtrenches could be seen at the bottom corners. Moreover, the profile was bowed, with an undercut visible under the hardmask and the critical dimensions (CD, 250 nm lines and spaces) of the line are not maintained because of plasma damage. Furthermore, such plasma damage during integration processing increases significantly with increasing porosity, consistent with plasma-induced damage testing on blanket wafers. The measured ULK line-to-line spacing at half-height decreases from a target value of 250 nm to 230 nm for ULK-2.2, 190 nm for ULK-2.0, and 105 nm for ULK-1.8.

In contrast, the profiles using the protected ULKs are of good quality, having been produced using the same processing conditions as the unprotected ULKs, without additional optimization, such as different etch chemistry or dielectric repair. All three profiles present straight sidewalls with good CD control. The trench bottoms are slightly rounded but are devoid of pitting or microtrenching. The nominal ULK line width and spacing at half height for all three ULKs is 250 nm. No blowout of the trench dimension was observed for the protected ULKs. Despite the results of FIG. 5—as discussed in additional detail at Frot, T. J., Volksen, W., Purushothaman, S., Bruce, R. L., Magbitang, T. P. Miller, D. C., Deline, V. R., Dubois, G., Post Porosity Plasma Protection: Scaling of Efficiency with Porosity, *Advanced Functional Materials*, 2012, 22(14), 3043-3050, the entire contents of which are incorporated herein by reference—undesirable dewetting was observed when the PMA copolymers were spin-applied to the respective ULK materials, which had not undergone plasma modification of a top portion thereof according to the techniques of this disclosure. As noted, a maximum filling level of less than 41% was obtained using methods not including the plasma-modification techniques disclosed herein. Low filling levels and the non-uniform, inhomogeneous filling across wafers would constitute a considerable limitation for the development of this process.

The pictures of FIG. 5 demonstrate that ULK film thickness loss after integration processing steps is greater with respect to unfilled ULK materials. Thus, damage during integration processing may be less severe for patterned ULK thin-films protected by the porosity filling techniques of this disclosure. As stated, the electron microscopy cross-sections reveal significant loss of critical dimensions for the unprotected ULK material (e.g., pitting, micro-trenching of the bottom line, and undercuts just below the hardmask), whereas the final trench profiles of the filled ULKs are very much alike, independent of the ULK material's k value. The patterning results of FIG. 5 further confirm that the plasma modification and filling techniques of this disclosure, among others, may provide a method for nearly damage-free integration of ULK materials. Moreover, the disclosed techniques permit the use of a broader range of polymers as filling material, since they permit improved compatibility between polymers and the surface chemistry of porous ULK materials.

Figure 7:
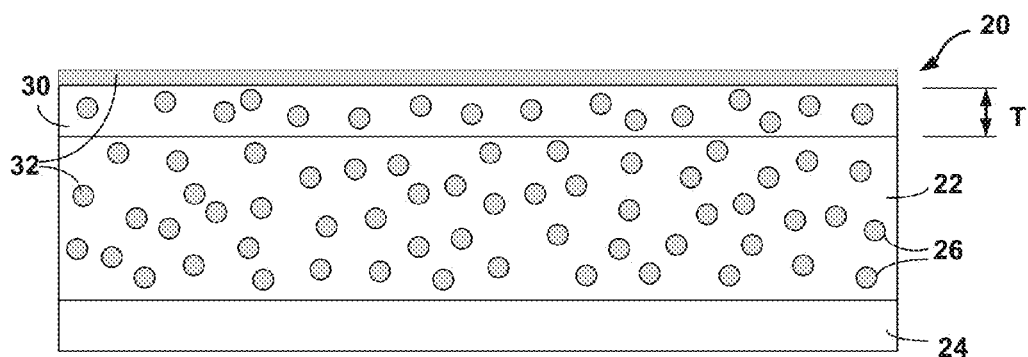
FIG. 7 is a lateral cross-sectional view of an exemplary structure after heating, according to the exemplary technique of FIG. 1.

The technique of FIG. 1 further includes applying filling material 32 to modified top portion 30 of first layer 22, where filling material 32 includes a polymer (14), as shown at FIG. 6. As noted, filling material 32 may further include a suitable solvent (e.g., organic solvent) and/or surfactant. FIG. 6 is a lateral cross-sectional view of an exemplary structure 20 after application of filling material 32 to modified top portion 30 of first layer 22 but prior to heating. The filling material may be applied, for example, by a spin-coating technique. After applying the filling material, the technique of FIG. 1 provides for heating of plasma-treated structure 20, filling material 32, or both, to enable filling material 32 to at least partially (or entirely) fill all or substantially all of plurality of pores 26 disposed throughout first layer 22. For example, structure 20 and/or filling material 32 may be heated at a temperature of between about 100° C. to about 300° C. for between about 5 minutes to about one hour. Upon heating plasma-treated structure 20 and/or filling material 32, filling material 32 fills a larger volume of plurality of pores 26 of first layer 22, and a sufficient amount of filling material 32 is applied so that a residual amount of filling material 32 remains disposed over all of top surface 28 of modified top portion 30 of first layer 22 (16), as shown at FIG. 7. In this way, for example, inhomogeneous filling of pores at top surface 28 of first layer 22 may be substantially eliminated (for example, nearly or entirely eliminated). FIG. 7 is a lateral cross-sectional view of an exemplary structure 20 after heating of structure 20 and/or filling material 32.

Figure 8:
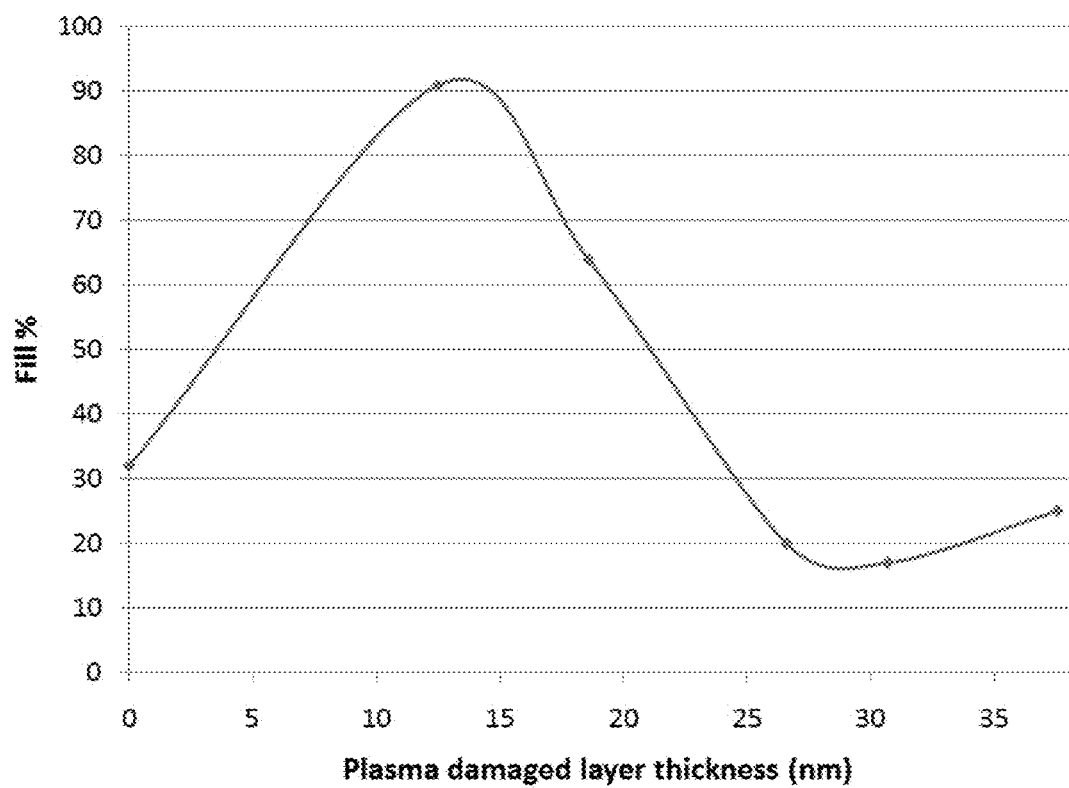
FIG. 8 is a chart illustrating a curve defined by fill percentages of the volumetric porosity of a first layer of an exemplary structure as a function of the thickness of plasma damage to a modified top portion of the first layer of the structure.

The filling levels of the volumetric porosity of first layer 22 that can be achieved, according to this disclosure, are directly connected to the thickness of the plasma damaged layer, as shown by the chart at FIG. 8. FIG. 8 is a chart illustrating curves defined by fill percentages of the volumetric porosity (e.g., plurality of pores 26) of first layer 22 of an exemplary structure 20 as a function of the thickness T of plasma damage to modified top portion 30 of first layer 22. The chart of FIG. 8 shows filling percentage levels of the volumetric porosity of first layer 22 as a function of $O_2$ plasma-damaged layer thickness of modified top portion 30 of first layer 22. The data points of the chart at FIG. 8 were generated by an oxygen plasma treatment of a spin-on ULK having a k value of 2.2. FIG. 8 shows that filling levels higher than 60% can be obtained when the damaged layer thickness is in the range of about 5 to about 20 nm. FIG. 8 further shows that filling levels higher than 80% can be obtained when the damaged layer thickness is in the range of about 10 to about 15 nm. These results indicate that there is an optimum damaged layer thickness range to maximize the filling level. Outside this range, the surface modification is either insufficient (for example, below about 5 nm) to materially change the filling material-to-ULK surface interaction, or too significant (for example, over about 20 nm), leading to pore sealing.

Thus, control of the thickness of modified top portion 30 of first layer 22, through optimization of plasma conditions, results in high filling levels. The nature of the plasma used to damage a low-k or ULK material over a precise thickness can be chosen from diverse gas sources, as shown, for example, at Table 2.

TABLE 2

| Plasma Treatment | Contact Angle | Optical Measurements | | X-ray Reflectivity | | Structure |
|---|---|---|---|---|---|---|
| | | t (nm) | RI | t (nm) | ρ (g·cm$^{-3}$) | |
| None | 97° | 600.3 | 1.293 | 599.1 | 0.956 | Pristine |
| 5 s Ar plasma, 200 W | 32° | 592.5 | 1.302 | 10.2 | 1.466 | Modified top portion |
| | | | | 574.8 | 0.966 | Pristine |
| 5 s CO plasma, 200 W | 6° | 583.9 | 1.311 | 19.8 | 1.75 | Modified layer |
| | | | | 561.2 | 0.907 | Pristine |
| 5 s NH$_3$ plasma, 200 W | 20° | 595.3 | 1.304 | 18.0 | 1.498 | Modified layer |
| | | | | 574.2 | 0.966 | Pristine |
| 5 s O$_2$ plasma, 200 W | 6° | 574.5 | 1.322 | 14.6 | 1.833 | Modified layer |
| | | | | 568.0 | 0.940 | Pristine |

Table 2 presents characteristics measured with respect to a spin-on ULK film having a k value of 2.0, namely, the "spin-on 3" film referenced in Table 1, after treatments with different ionized gas sources optimized at a power of 200 watts for five seconds. Properties of a spin-on ULK having no plasma treatment also were measured, for reference. XRR data in Table 2 show that with optimized Ar, CO, NH$_3$ and O$_2$ plasma treatments, a modified thickness of first layer 22 in the range of about 10 nm to about 20 nm can be achieved. Table 2 also presents data regarding the contact angle of the ULK after treatment with the respective plasma, a measurement indicative of the hydrophilicity of the surface of the ULK. A surface is generally considered hydrophilic if the contact angle of water is less than 45° on the surface, and hydrophobic if the contact angle of water is greater than 90°. Optical measurements of the refractive indices and thickness (in nm) of the plasma-treated ULK materials of Table 2 were taken by spectro-reflectometry. The thickness of the ULK film also was measured using XRR, with the thickness of modified top portion 30 of first layer 22 being presented in the upper field of the thickness ("t") column, and the thickness of the portion of first layer 22 underlying modified top portion 30 being presented in the lower field of the column "t" measured in nm (designated as "pristine" meaning unmodified with a plasma as compared to its original form), shown with respect to each different plasma-treated ULK thin-film. The density of these respective layers of first layer 22 also is shown, measured by XRR.

In applying the techniques disclosed herein, as shown at Table 3, filling levels up to (and higher than) 90% were obtained for plasma treated ULK materials, as compared to a reference material (the "unfilled ULK" material) with only a 3% filling level. Apart from the aforementioned unfilled ULK material, the data of Table 3 were generated using a spin-on ULK having a k value of 2.0. The displayed characteristics were measured after optimized plasma treatment (at the setting shown) and after filling material 32 had been introduced into the porosity of the ULK materials.

TABLE 3

| Plasma treatment | X-ray Reflectivity | | Fill % | Structure |
|---|---|---|---|---|
| | t(nm) | ρ (g·cm$^{-3}$) | | |
| None | 585.9 | 0.970 | 3% | Unfilled ULK |
| 5 s Ar plasma, 200 W | 11.3 | 1.695 | N/A | Modified top portion |
| | 575.8 | 1.35 | 97% | Filled ULK |

TABLE 3-continued

| Plasma treatment | X-ray Reflectivity | | Fill % | Structure |
|---|---|---|---|---|
| | t(nm) | ρ (g·cm$^{-3}$) | | |
| 5 s CO plasma, 200 W | 15.5 | 1.916 | N/A | Modified top portion |
| | 565.8 | 1.369 | 100% | Filled ULK |
| 5 s NH$_3$ plasma, 200 W | 16.2 | 1.719 | N/A | Modified top portion |
| | 574.7 | 1.345 | 95% | Filled ULK |
| 5 s O$_2$ plasma, 200 W | 15.1 | 1.84 | N/A | Modified top portion |
| | 570.0 | 1.311 | 87% | Filled ULK |

As shown, each ULK thin-film of Table 3 was treated with a different plasma for 5 seconds at a power of 200 watts. XRR was used to measure the density and thickness of the modified top portion of the first layer (dielectric thin-film), and the portion of the first layer underlying the modified top portion (designated "Filled ULK"). Optimally modified ULK materials may be filled to enhance protection of the ULK during subsequent integration processing. This disclosure also contemplates minimization of the thickness of modified top layer 30 (for example by a DHF soak, as described more fully below), as needed for compatibility with further integration steps.

Figure 9A:
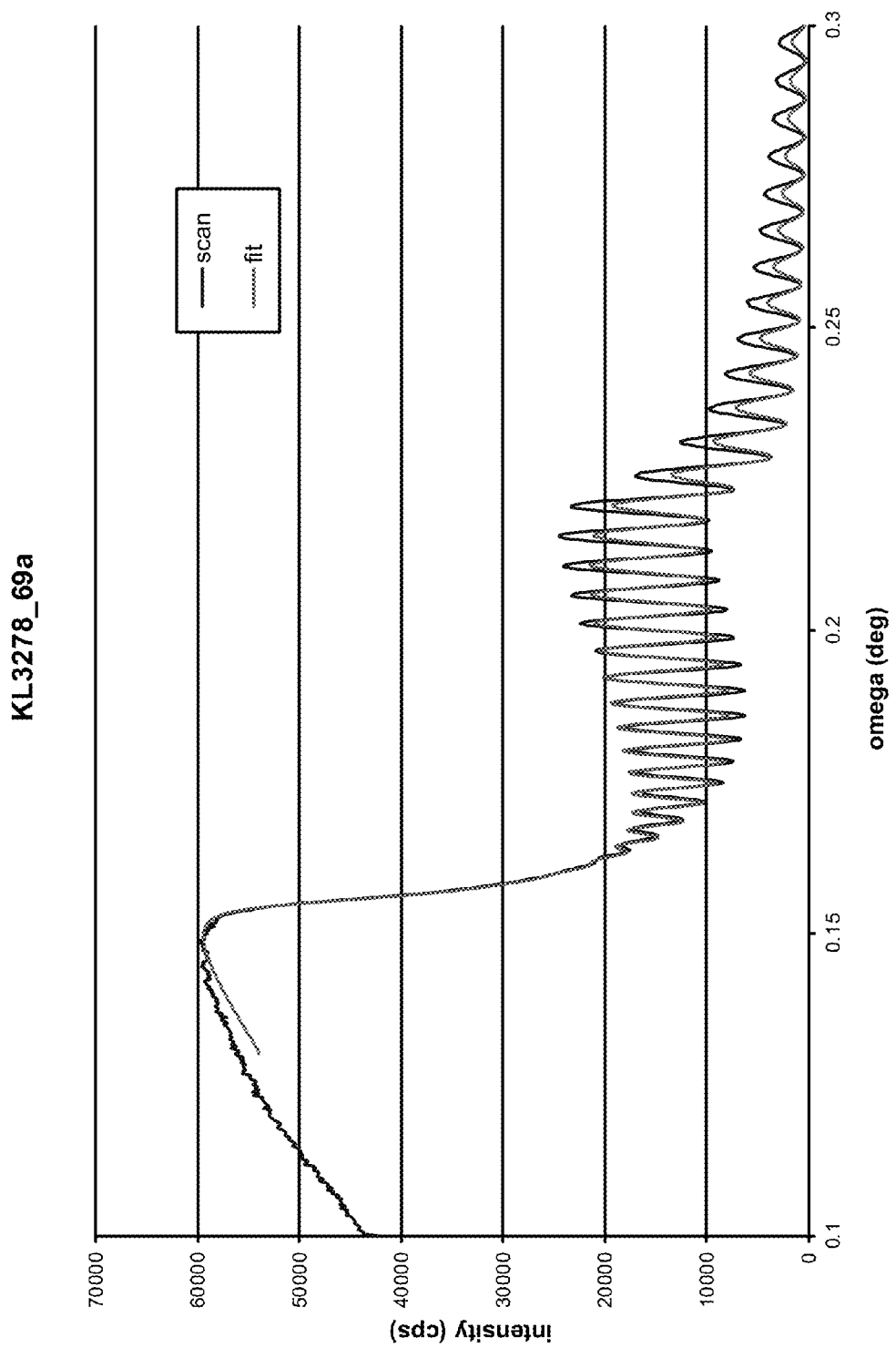
Figure 9B:
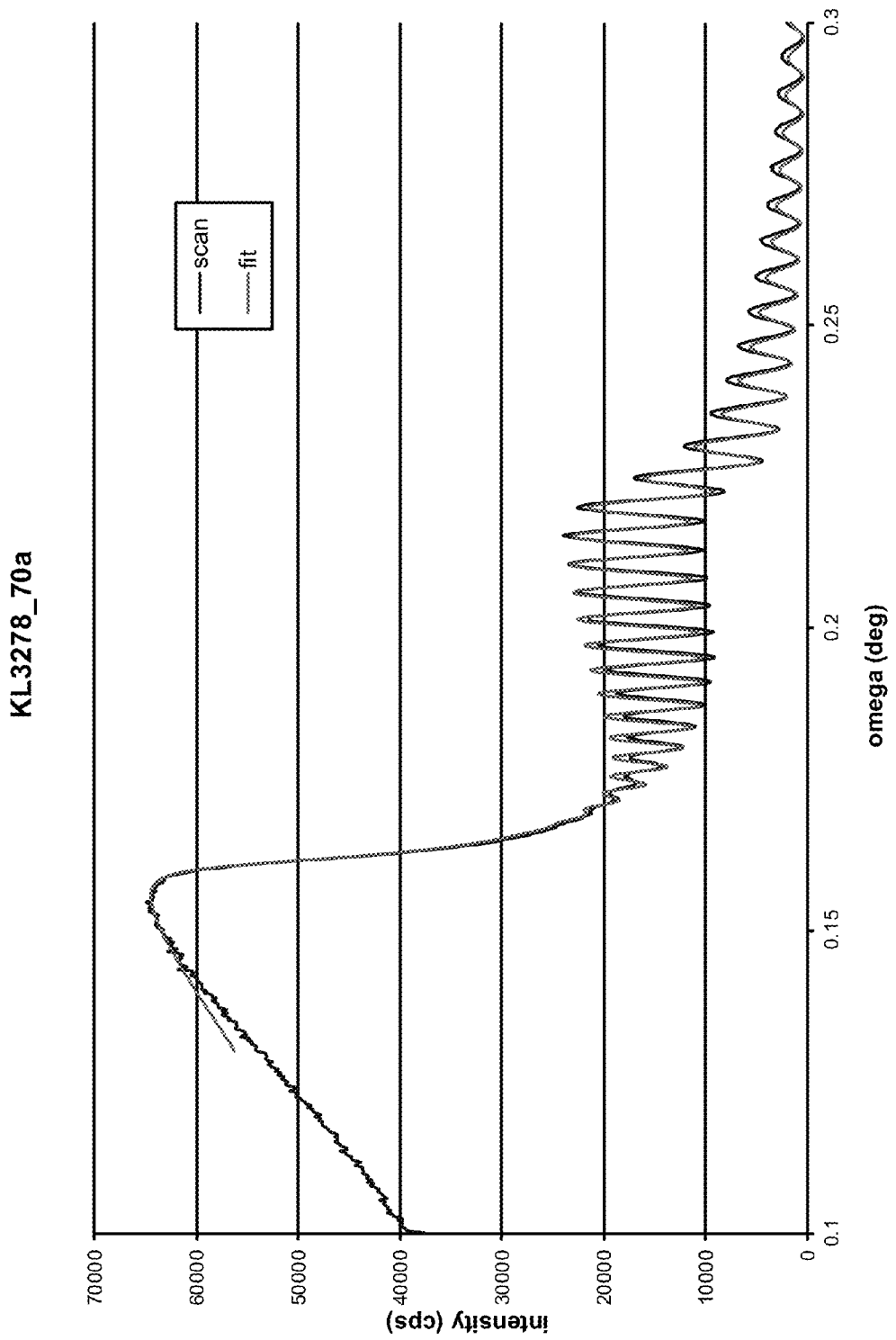
Figure 9C:
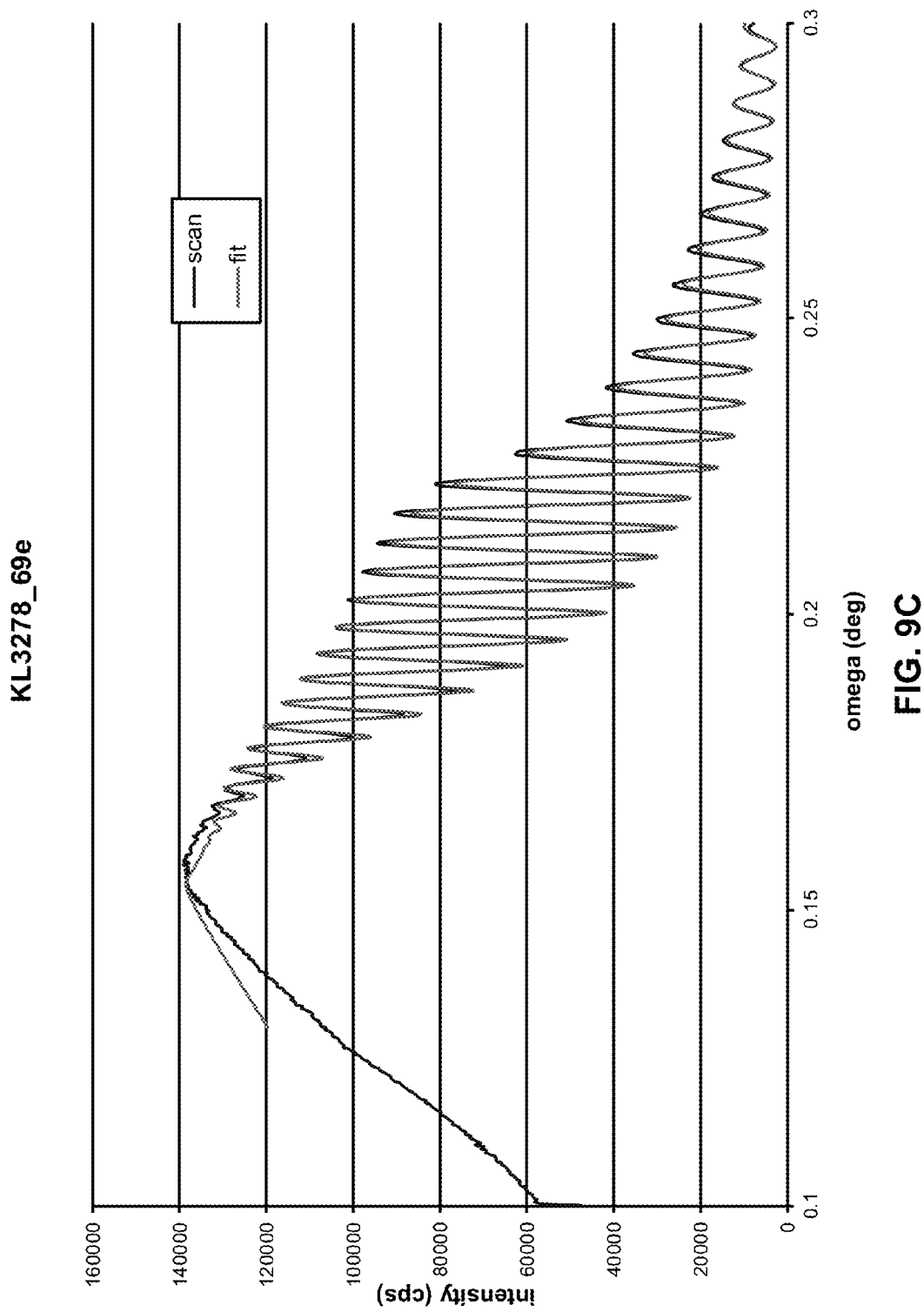
Figure 9D:
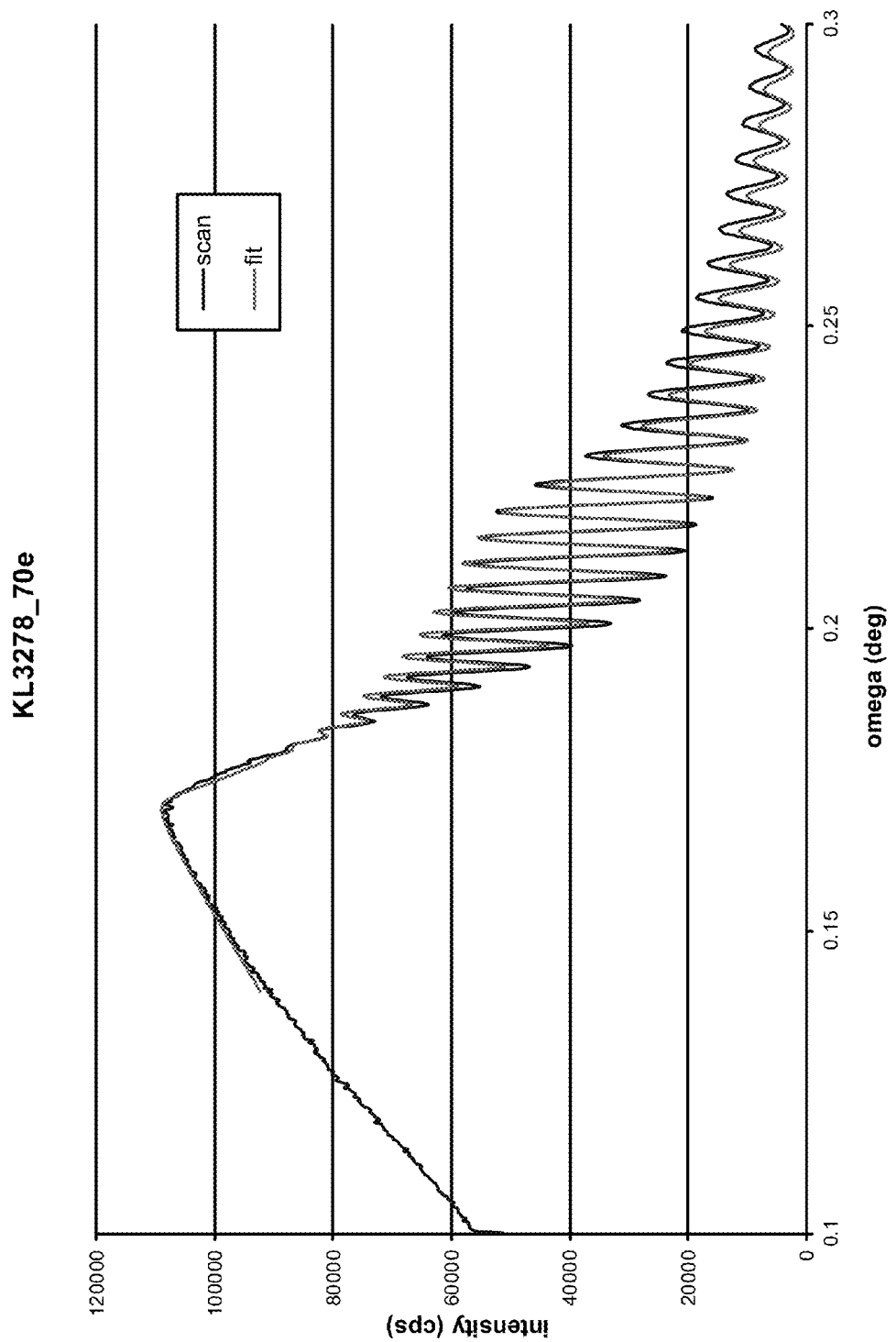

The following Examples 1, 2, and 3 pertain to, among other things, optimization of the power of the plasma applied to first layer 22, with respect to the techniques described herein, including that of FIG. 1. The Examples present characteristics of different sample dielectric thin-film layers on substrates at varying plasma power wattages, both before and after filling of the porosity of the dielectric films with a filling material, as measured optically and by XRR. The data of the Examples also correspond to the charts of FIGS. 9A-9L of this disclosure. FIGS. 9A to 9L, as further described below, are charts illustrating x-ray reflectivity scans of exemplary structures.

age (percentage of volumetric porosity of ULK layer filled). As noted in reference to Example 1, the chart in FIG. 9A of sample KL3278-69a shows an XRR curve, with intensity (measured in counts per second (cps)) displayed as a function of the incident angle omega of the x-ray (measured in degrees), for a porous ULK layer not filled with a filling material. FIG. 9A also displays thickness (in nm) and density (in $g/cm^3$) of a ULK thin-film layer and the substrate which the ULK layer overlies. FIG. 9B includes a chart of sample KL3278-70a, showing an XRR curve of the sample after having been filled with the filling material referenced at Example 1. Without plasma modification of a top portion of the ULK material, a fill percentage of only 32% is obtained.

Example 1 further includes XRR data for samples KL3278-69e (before pore filling with referenced filling mate-

Example 1

| | | | Before Fill | | | | After Fill | | | | |
| | | | Optical | | XRR data | | Optical | | | XRR data | | |
| Sample # | Plasma | Pore filling | t (nm) | n | t (nm) | ρ ($g/cm^3$) | t (nm) | n | layer | t (nm) | ρ ($g/cm^3$) | Fill % |
|---|---|---|---|---|---|---|---|---|---|---|---|---|
| KL3278-69a | None | None | 598.8 | 1.334 | 591.6 | 1.088 | — | — | 1 | — | — | 0 |
| KL3278-70a | None | 4.1 kDa PPG @ 20% in PGMEA | 598.8 | 1.334 | — | — | 600.4 | 1.370 | 1 | 592.1 | 1.176 | 32% |
| kL3278-69e | O2, 5 sec, 200 W | None | 17.2 573.2 | 1.569 1.333 | 9.4 3.1 576.1 | 1.998 1.793 1.092 | — — | — — | 3 2 1 | — — | — — | 0 |
| KL3278-79e | O2 5 sec, 200 W | 4.1 kDa PPG @ 20% in PGMEA | 17.2 573.2 | 1.569 1.333 | — — | — — | 593.3 | 1.446 | 3 2 1 | 4.0 8.0 578.0 | 2.200 1.800 1.344 | 91% |

Example 1 presents characteristics of ULK sample KL3278-69a (before pore filling, as further shown at FIG. 9A) and sample KL3278-70a (i.e., sample KL3278-69a, after pore filling with the referenced filling material, see FIG. 9B). FIGS. 9A and 9B illustrate charts reflecting XRR measurements of an exemplary first layer (namely, a porous ULK material) not modified by a plasma. Among other things, the data of Example 1 include the thickness (in nm) and the refractive index "n" of the sample ULK material, measured optically both before and after fill of the ULK material's pores with the referenced filling material. Example 1 also includes characteristics of the sample ULK layers measured by XRR after filling of the volumetric porosity of the ULK layers with the referenced filling material, namely, layer (or portion of the layer) thickness (in nm), density (in $g/cm^3$), and fill percentrial, which corresponds to FIG. 9C) and KL3278-70e (after pore filling, which corresponds to FIG. 9D). The XRR data of this ULK layer, as shown in Example 1, give evidence of a density gradient (represented by layers 2 and 3) in the modified top portion 30 of first layer 22 due to the plasma treatment. Layer 1 presented at Example 1 corresponds to that portion of first layer 22 underlying modified top portion 30. For samples KL3278-69e and KL3278-70e, ionized oxygen gas was applied to the ULK layer samples for 5 seconds at a power of 200 watts. Following treatment under these plasma conditions, 91% of the volumetric porosity of sample ULK KL3278-70e was able to be filled with the referenced filling material, namely, a solution of 20 wt. % PPG (Mw=4,100 daltons) in PGMEA.

Example 2

| | | | Before Fill | | | | After Fill | | | |
| | | | Optical | | XRR data | | | XRR data | | |
| Sample # | Plasma | Pore filling | t (nm) | n | t (nm) | ρ ($g/cm^3$) | Layer | t (nm) | ρ ($g/cm^3$) | Fill % |
|---|---|---|---|---|---|---|---|---|---|---|
| KL3325-2a | O2, 5 sec, 400 W | None | 20.2 564.3 | 1.545 1.328 | 13.5 5.1 564.6 | 1.903 1.647 1.097 | 3 2 1 | — — — | — — — | 0 |
| KL3325-3a | O2, 5 sec 400 W | 4.1k PPG @ 20 wt % in PGMEA | 20.2 564.3 | 1.547 1.328 | — — | — — | 3 2 1 | 8.3 11.2 563.0 | 2.221 1.620 1.273 | 64% |

-continued

Example 2

| Sample # | Plasma | Pore filling | Before Fill | | | | | After Fill | | | |
|---|---|---|---|---|---|---|---|---|---|---|---|
| | | | Optical | | XRR data | | | XRR data | | | |
| | | | t (nm) | n | t (nm) | ρ (g/cm$^3$) | Layer | t (nm) | ρ (g/cm$^3$) | Fill % |
| KL3325-2e | O2, 5 sec 600 W | None | 31.9 553.2 | 1.509 1.329 | 6.8 19.8 553.8 | 2.198 1.637 1.088 | 3 2 1 | — — — | — — — | 0 |
| KL3325-3e | O2, 5 sec 600 W | 4.1k PPG @ 20 wt % in PGMEA | 31.9 553.2 | 1.509 1.329 | — — | — — | 3 2 1 | 4.7 22.7 553.8 | 2.238 1.579 1.143 | 20% |

Figure 9E:
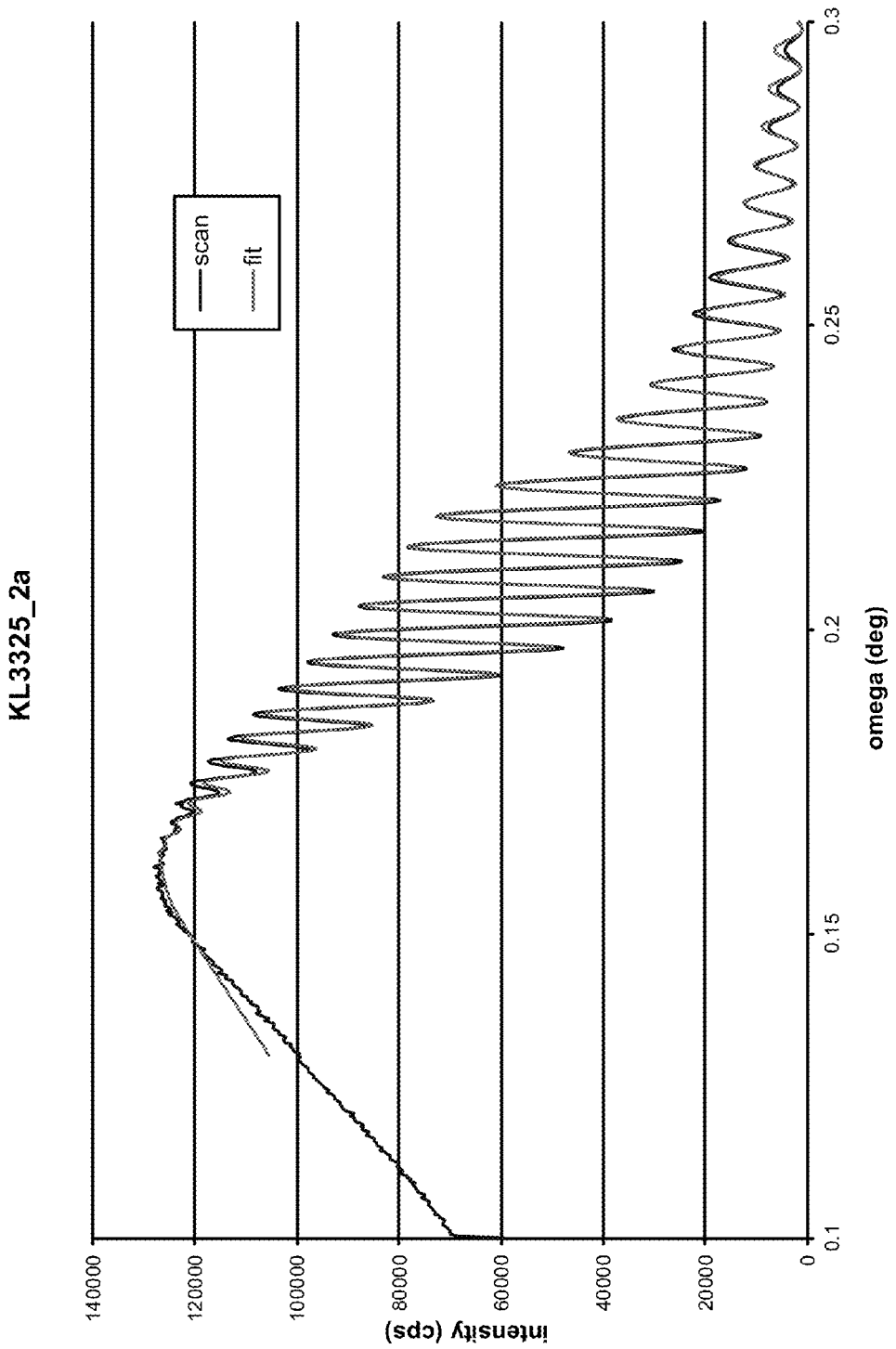
Figure 9G:
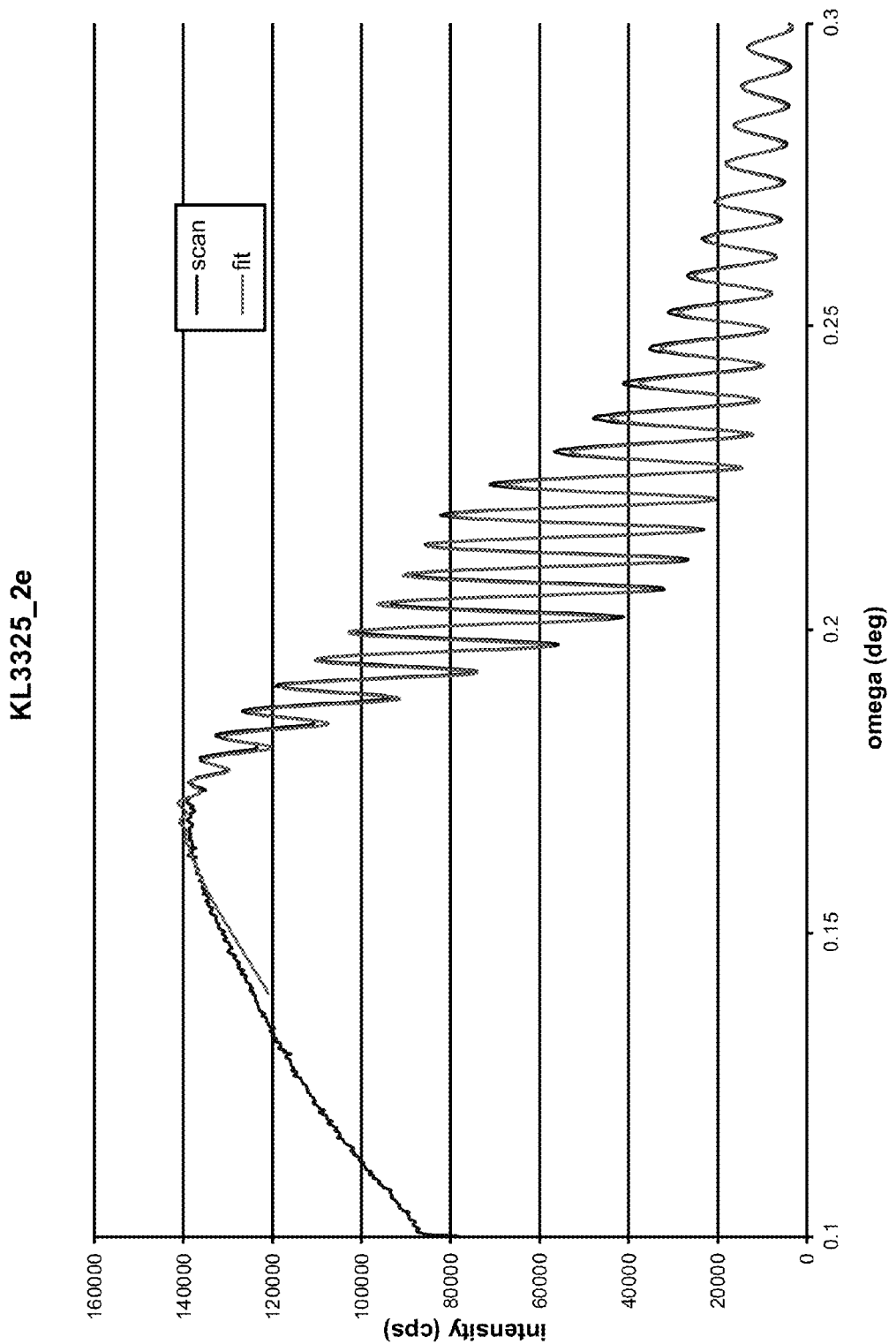

Example 2 presents characteristics of ULK sample KL3325-2a (before pore filling, see FIG. 9E) and sample KL3325-3a (i.e., sample KL3325-2a, after pore filling with the referenced filling material, see FIG. 9F). The types of data presented in Example 2 are the same types as described above with respect to Example 1. FIGS. 9E and 9F illustrate charts reflecting XRR measurements of a porous ULK material modified by a plasma, before and after filling with a filling material, as further described in Example 2. For samples KL3325-2a and KL3325-3a, ionized oxygen gas was applied to the ULK layer samples for 5 seconds at a power of 400 watts. Following treatment under these plasma conditions, 64% of the volumetric porosity of sample ULK KL3325-3a was able to be filled with a solution of 20 wt. % PPG (Mw=4,100 daltons) in PGMEA.

Figure 9H:
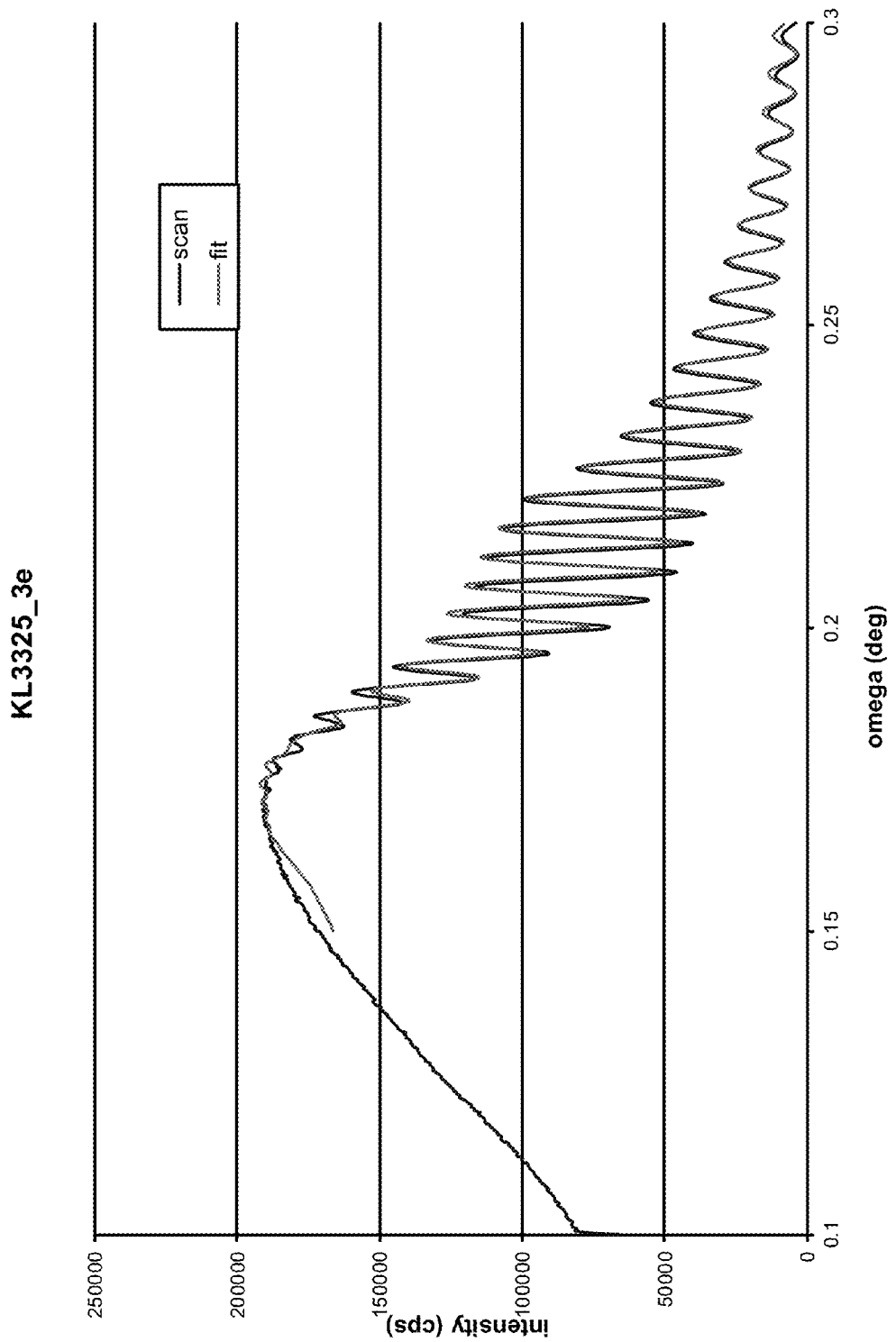

Example 2 further includes XRR data for samples KL3325-2e (before pore filling with referenced filling material, see FIG. 9G) and KL3325-3e (after pore filling, see FIG. 9H). The XRR data of this ULK layer, as shown in Example 2, give evidence of a density gradient (represented by layers 2 and 3) in the modified top portion 30 of first layer 22 due to the plasma treatment. Layer 1 corresponds to that portion of first layer 22 underlying modified top portion 30. For samples KL3325-2e and KL3325-3e, ionized oxygen gas was applied to the ULK layer samples for 5 seconds at a power of 600 watts. Following treatment under these plasma conditions, 20% of the volumetric porosity of sample ULK KL3325-3e was able to be filled with a solution of 20 wt. % PPG (Mw=4,100 daltons) in PGMEA.

Figure 9I:
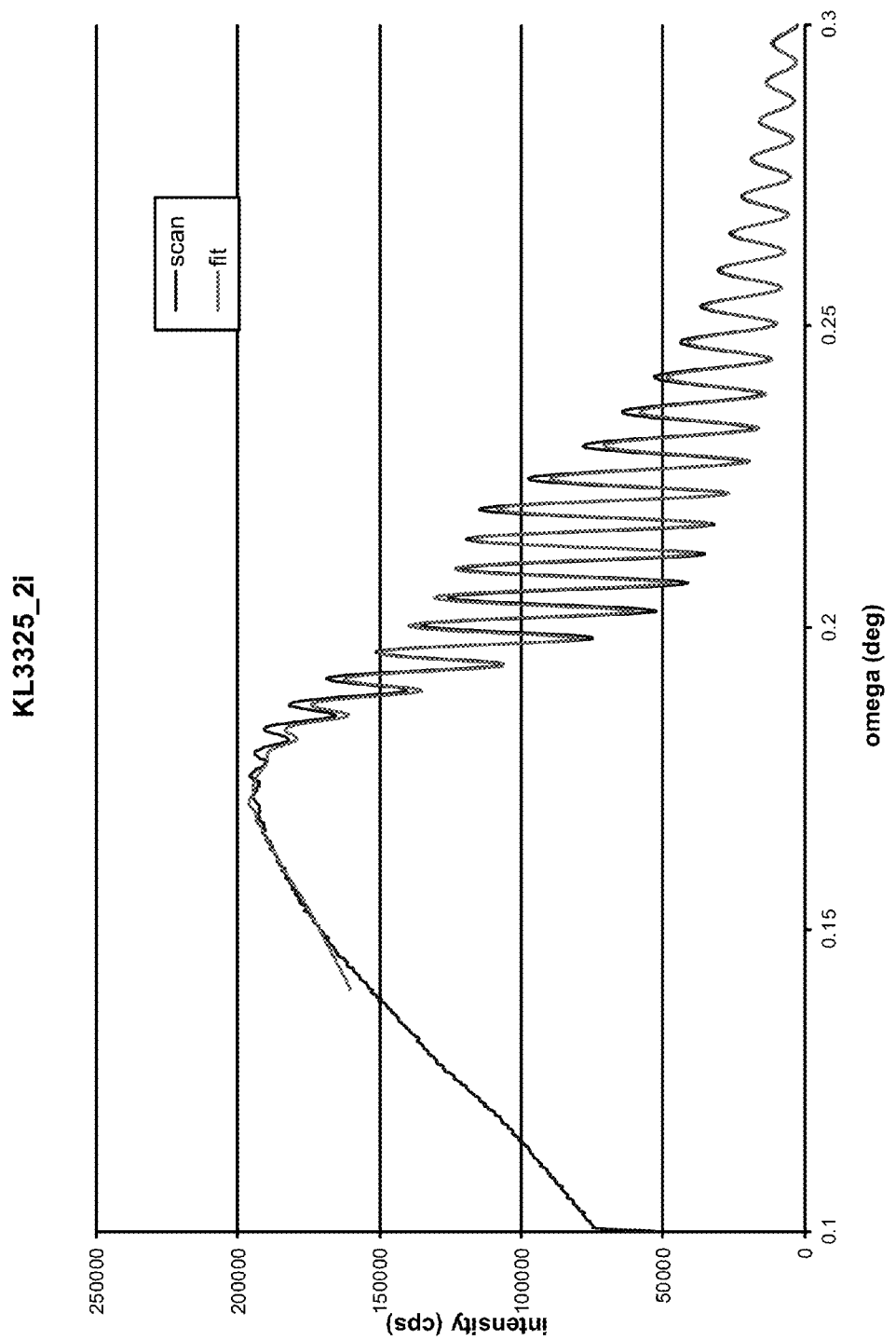
Figure 9J:
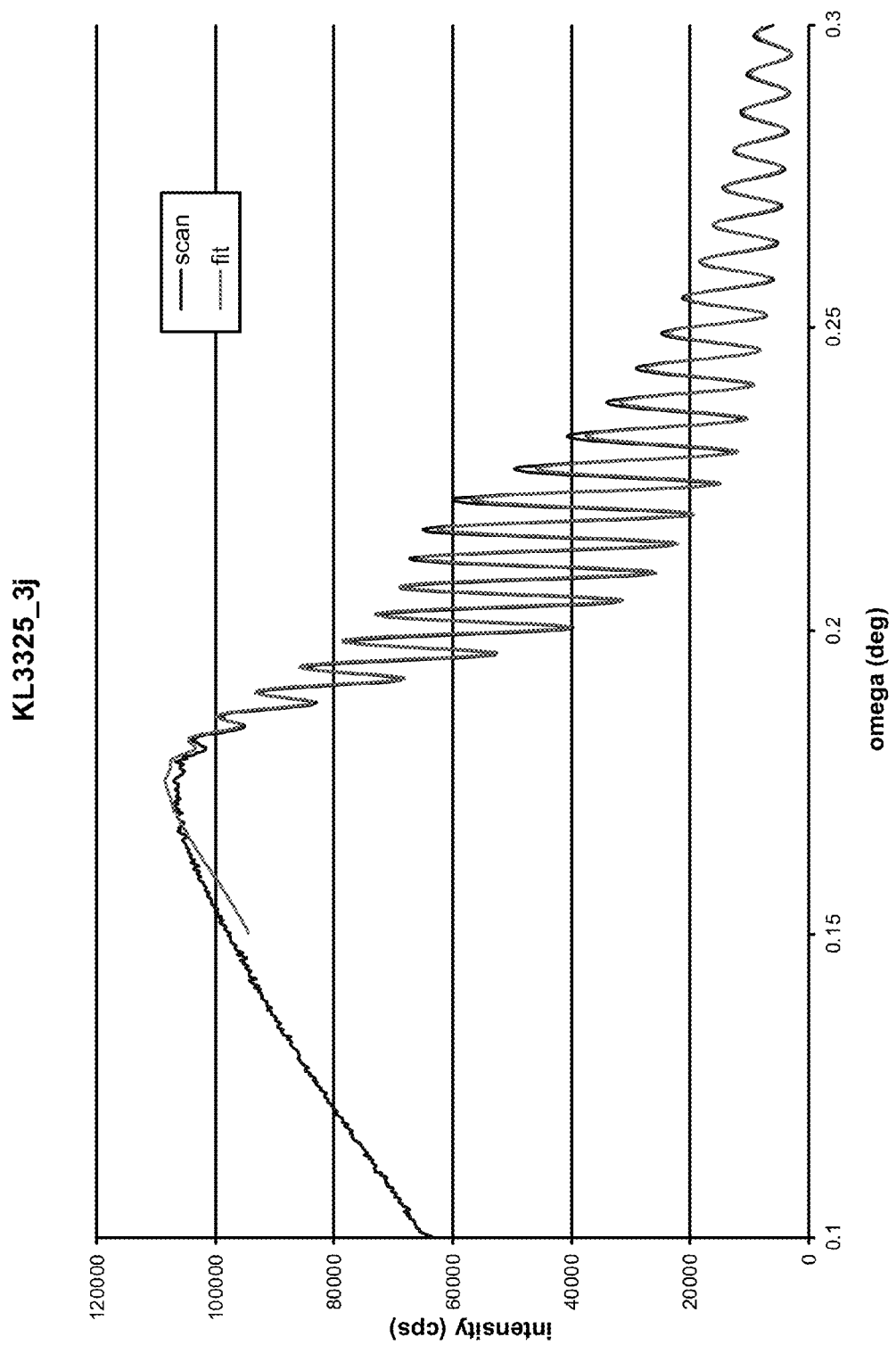
Figure 9K:
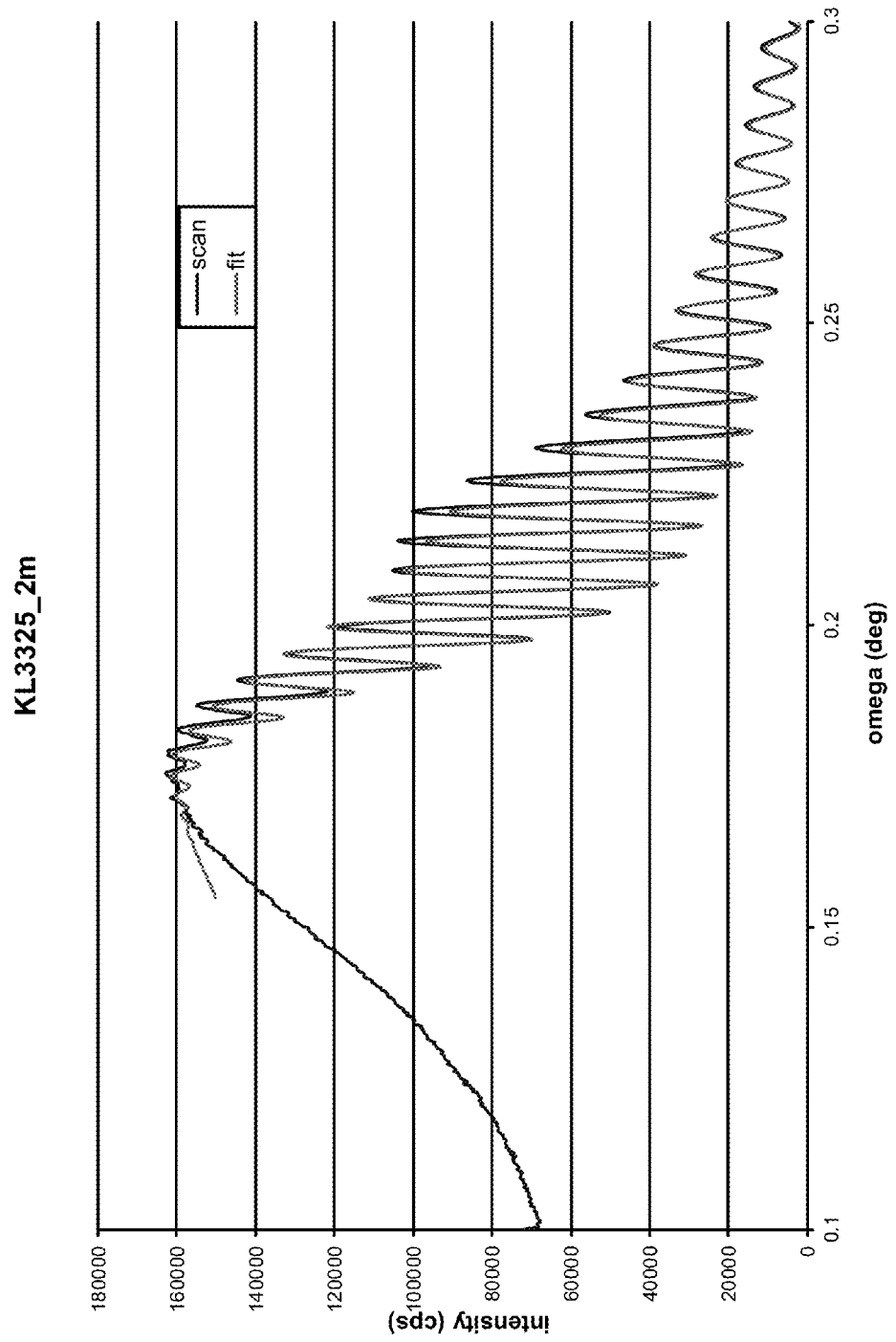

Example 3 presents characteristics of ULK sample KL3325-2i before pore filling (corresponding to FIG. 9I), and sample KL3325-3j (corresponding to FIG. 9J), namely, sample KL3325-2i after pore filling with the referenced filling material. The types of data presented in Example 3 are the same types as described above with respect to Example 1. FIGS. 9I and 9J illustrate charts reflecting XRR measurements of a porous ULK material modified by a plasma, before and after filling with a filling material, respectively, as further described in Example 3. For samples KL3325-2i and KL3325-3j, ionized oxygen gas was applied to the ULK layer samples for 5 seconds at a power of 800 watts. Following treatment under these plasma conditions, 17% of the volumetric porosity of sample ULK KL3325-3j was able to be filled with a solution of 20 wt. % PPG (Mw=4,100 daltons) in PGMEA.

Figure 9L:
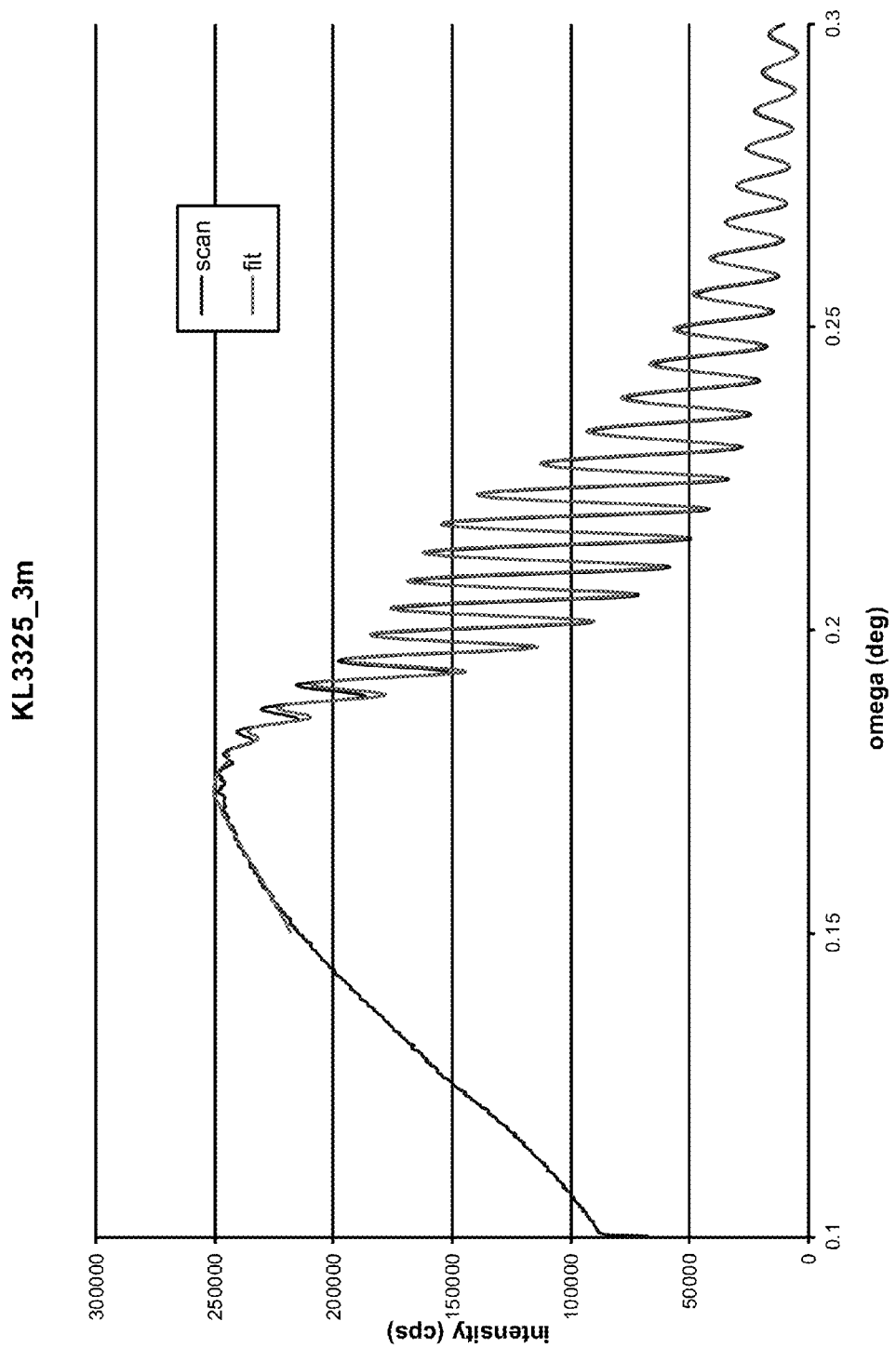

Example 3 further includes XRR data for samples KL3325-2m (before pore filling with referenced filling material, see FIG. 9K) and KL3325-3m (after pore filling, see FIG. 9L). The XRR data of this ULK layer, as shown in Example 3, give evidence of a density gradient (represented by layers 2 and 3) in the modified top portion 30 of first layer 22 due to the plasma treatment. Layer 1 corresponds to that portion of first layer 22 underlying modified top portion 30. For samples KL3325-2m and KL3325-3m, ionized oxygen gas was applied to the ULK layer samples for 5 seconds at a power of 1000 watts. Following treatment under these plasma conditions, 25% of the volumetric porosity of sample ULK Example 3

| Sample # | Plasma | Pore Filling | Before Fill | | | | | After Fill | | | |
|---|---|---|---|---|---|---|---|---|---|---|---|
| | | | Optical | | XRR data | | | XRR data | | | |
| | | | t (nm) | n | t (nm) | ρ (g/cm$^3$) | layer | t (nm) | ρ (g/cm$^3$) | Fill % |
| KL3325-2i | O2, 5 sec, 800 W | None | 38.0 546.5 | 1.488 1.321 | 12.4 18.3 548.6 | 1.963 1.642 1.091 | 3 2 1 | — — — | — — — | 0 |
| KL3325-3j | O2, 5 sec 800 W | 4.1k PPG @ 20 wt % in PGMEA | 39.9 547.0 | 1.466 1.318 | — — | — — | 3 2 1 | 9.3 22.4 548.3 | 2.122 1.645 1.138 | 17% |
| KL3325-2m | O2, 5 sec 1000 W | None | 39.0 548.7 | 1.462 1.324 | 12.3 25.3 545.7 | 1.955 1.535 1.090 | 3 2 1 | — — — | — — — | 0 |
| KL3325-3m | O2, 5 sec 1000 W | 4.1k PPG @ 20 wt % in PGMEA | 39.0 548.7 | 1.462 1.324 | — — | — — | 3 2 1 | 12.6 24.9 545.7 | 2.071 1.584 1.160 | 25% |

KL3325-3m was able to be filled with a solution of 20 wt. % PPG (Mw=4,100 daltons) in PGMEA.

Figure 10:
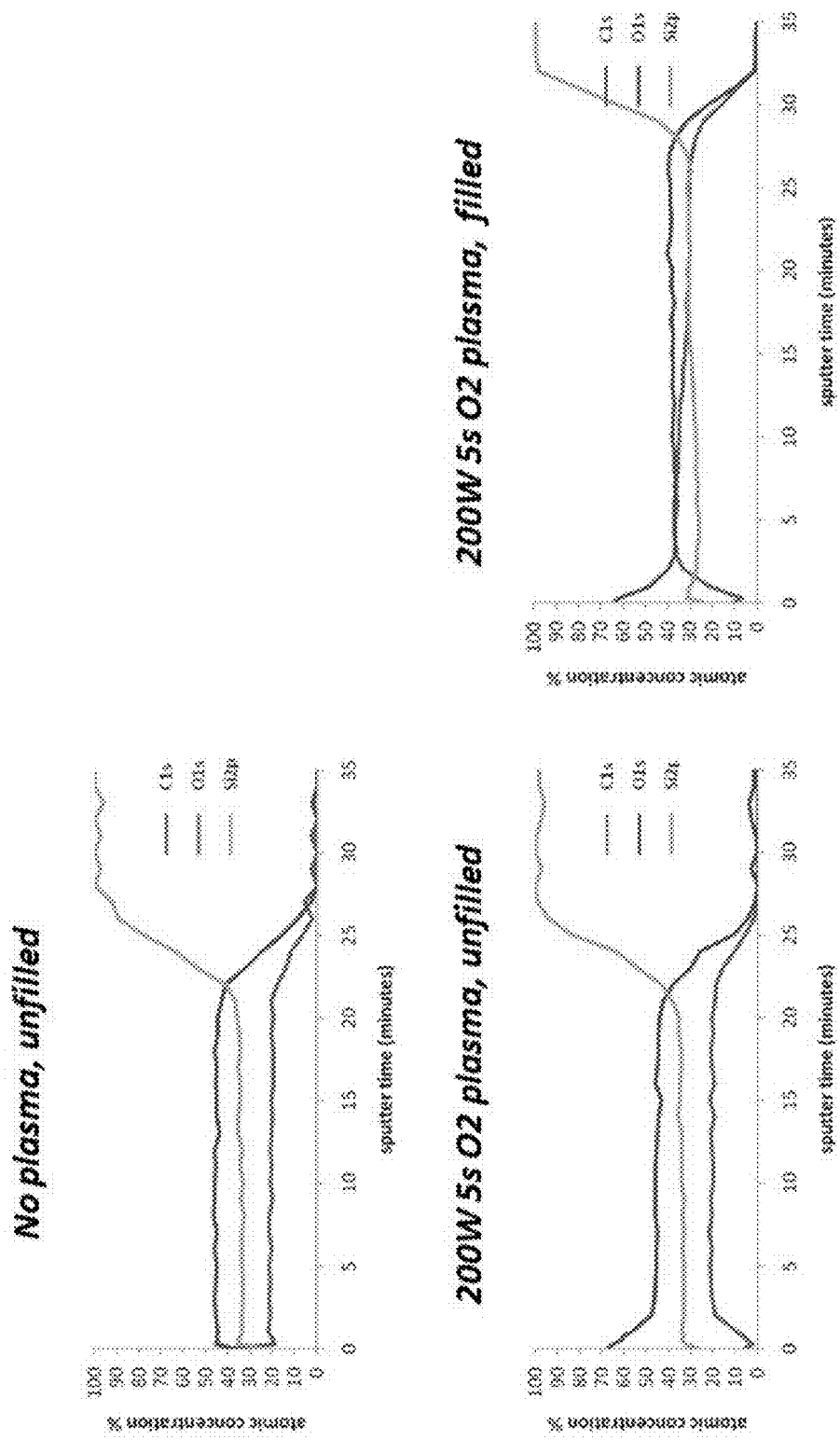
FIG. 10 illustrates charts showing curves generated by x-ray photoelectron spectroscopy of sample structures.

FIG. 10 illustrates charts showing curves generated by x-ray photoelectron spectroscopy of exemplary structures. The charts show respective compositional percentages of atomic carbon, oxygen, and silicon in the ULK layer on a substrate, as the ULK layer on a substrate is irradiated with a beam of x-rays over time. The three charts of FIG. 10 show the atomic concentration percentages of such a sample that is untreated with plasma and unfilled with filling material, a sample that has been treated with 200 watts of O2 plasma for 5 seconds but not with filling material, and a sample that has been treated with 200 watts of O2 plasma for 5 seconds and whose porosity of the ULK layer has been filled with filling material. As expected, the curves of the chart of FIG. 10 in which the ULK layer has been filled with an organic polymer show higher carbon-content levels during most of the sputter time period. The relatively constant respective atomic concentration percentages as a function of sputtering time for both the unfilled and filled ULK layers also indicate a homogenous composition of the structure, as well as a homogenous fill with respect to the curve of the filled ULK layer.

As shown in Table 4, a DHF soak was performed on the referenced ULK thin-films after filling of the pores with the filling material. The data of Table 4 were generated with respect to a spin-on ULK having a k value of 2.0, following optimized plasma treatment, a filling process (as described in previous Tables), a DHF soak, and a 400° C. bake. The DHF soak may dissolve some or all of modified top portion 30 of first layer 22 of the thin-films. For the tested ULK materials, the plasma-modified layer thickness was minimized to between about 5 and about 10 nm after a DHF soak. The plasma-modified layer may not be entirely removed due to the presence of the organic filling material, which can protect the ULK material. In any case, a remaining modified layer in the range of 5 to 10 nm may be compatible with BEOL integration, as such a layer may be removed during chemical mechanical planarization (CMP). After the DHF soak, the dielectric thin-films of Table 4 were heated at 400° C. for about 15 minutes to decompose and eliminate the filling material from the porosity of first layer 22, as referenced in the method of FIG. 1. After the 400° C. bake, XRR measurements show that the main bulk density drops from more than 1.3 g/cm$^3$ to a value close to the pristine ULK's density (0.956 g/cm$^3$, from Table 2), indicating that filling material 32 has been fully burned out.

steps, since the integration steps are carried out on a non-porous, high carbon content material. As noted, the filling material (or sacrificial agent) may ultimately be burned out after integration, returning the ULK's dielectric constant back to its initial value. Contrary to other strategies, the techniques of this disclosure benefit from achieving favorably low k values, namely, higher porosity in ULKs, because the disclosed techniques allow for high levels of polymer to be introduced into the volumetric porosity of first layer 22 of structure 20, with limited to no dewetting occurring at top surface 28 of first layer 22, leading to enhanced protection of the ULK.

In another exemplary technique of this disclosure, a plasma may be utilized to modify top portion 28 of first layer 22 of structure 20 to form a modified top portion 30, where (as noted) first layer 22 includes a dielectric material comprising plurality of pores 26, plurality of pores 26 remain substantially unsealed after the plasma modification, modified top portion 30 of first layer 22 has a thickness "T" in the range of about 5 to about 20 nm, and structure 20 including first layer 22 and substrate 24, where first layer 22 overlies substrate 24. In such an exemplary technique, after plasma modification, filling material 32 may be applied to modified top portion 30 (as shown in FIG. 6), the filling material including a polymer, as noted above. Further, after applying the filling material, plasma-treated structure 30 or filling material 32 (or both) may be heated (for example, heated by any suitable means that may heat the structure or filling material alone, or both items) to enable filling material 32 to fill at least 50% of the volumetric porosity in first layer 22 defined by plurality of pores 26. Upon such heating, a residual amount of filling material 32 may remain disposed over all of top surface 28 of modified top portion 30 (see, e.g., FIG. 7). In some examples, at least 80% (for example, at least 90%) of the volumetric porosity of first layer 22 may be filled (see, e.g., FIG. 8).

Figure 11A:
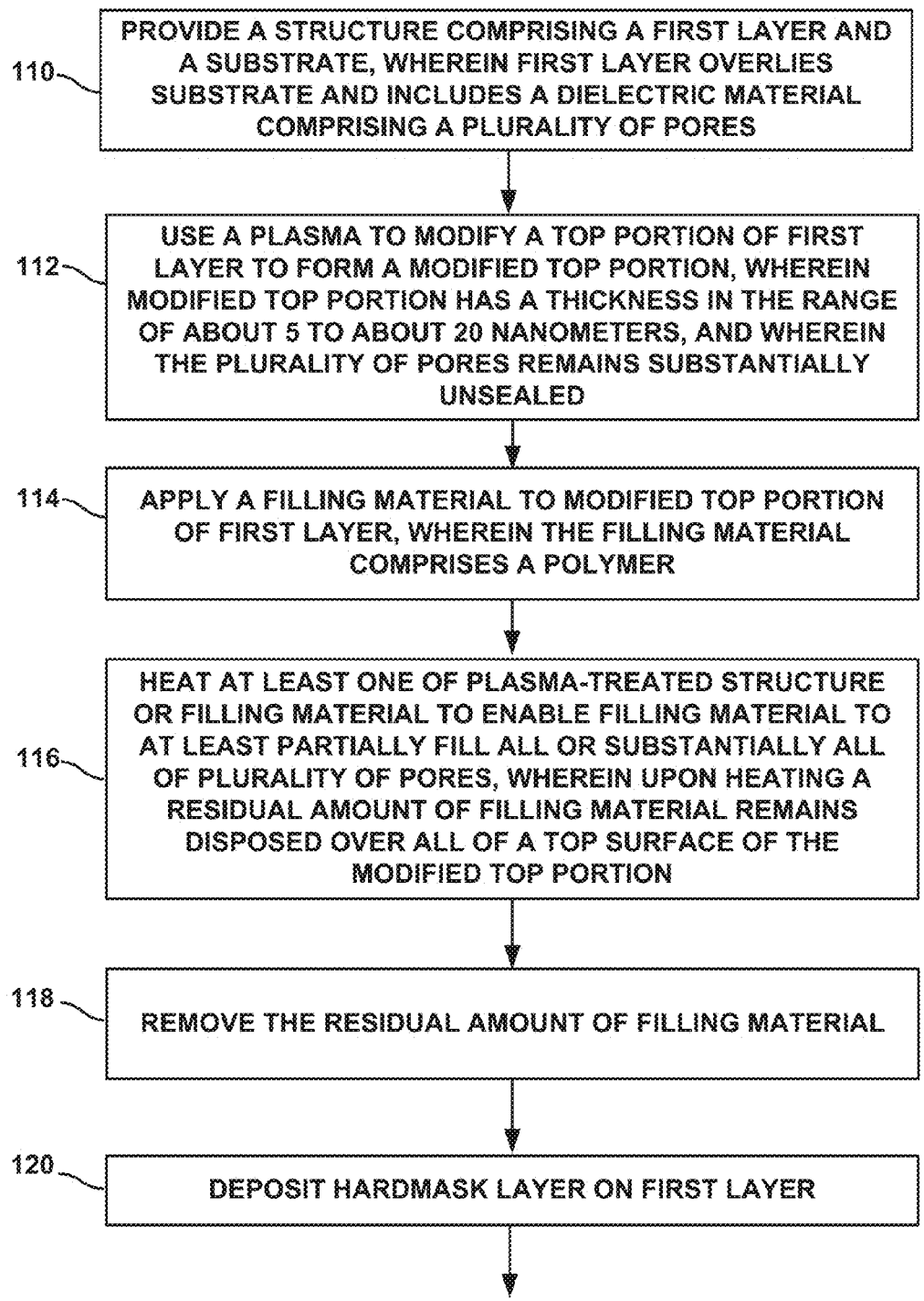
FIGS. 11A and 11B are first and second parts of a continuous flow diagram illustrating an exemplary technique for using a plasma to modify a first layer of a structure having a plurality of pores and for filling the pores, followed by subsequent integration processing steps.
Figure 11B:
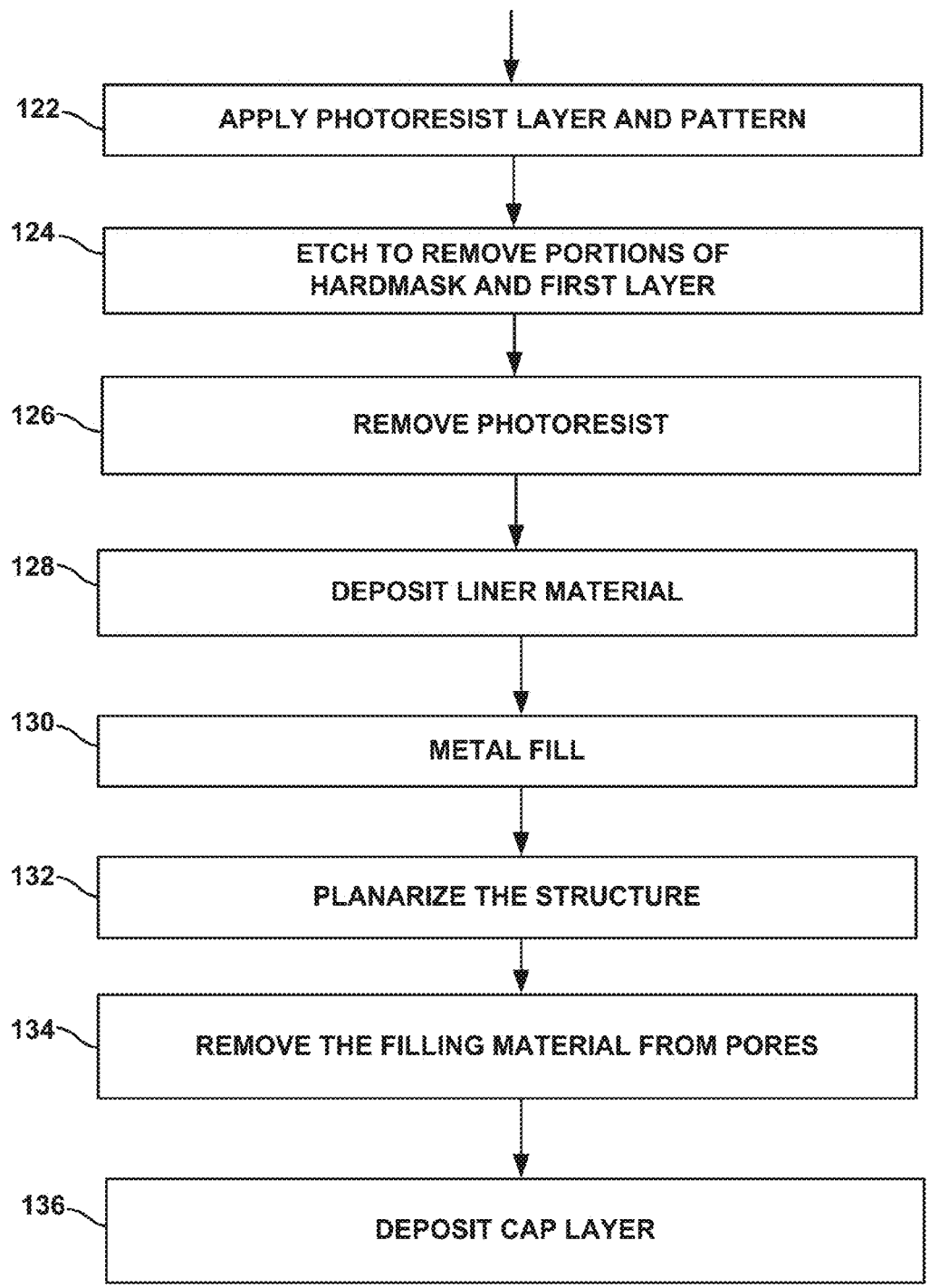

FIGS. 11A and 11B are first and second parts of a continuous flow diagram illustrating an exemplary technique for using a plasma to modify a first layer of a structure having a plurality of pores and for filling the pores, followed by subsequent integration processing steps. FIGS. 11A and 11B describe an exemplary technique according to this disclosure illustrating how filling the pores of a porous dielectric film (e.g., a low-k or ULK dielectric film) may be beneficial for processing carried out on a structure, such as a wafer. The described technique may be used, for example, in forming a single-damascene interconnect structure. Different structures

TABLE 4

| Plasma treatment | Fill % | First Layer | d-HF | 400° C. | X-Ray Reflectivity after d-HF soak and 400° C. bake | |
|---|---|---|---|---|---|---|
| | | | | | t (nm) | ρ (g·m$^{-3}$) |
| None | 3% | Unfilled porous ULK | X | X | 582.7 | 0.961 |
| 5 s Ar plasma, 200 W | N/A | Modified top portion | X | X | 8.4 | 1.227 |
| | 97% | Filled porosity/baked ULK | | | 575.9 | 0.974 |
| 5 s CO plasma, 200 W | N/A | Modified top portion | X | X | 4.8 | 1.54 |
| | 100% | Filled porosity/baked ULK | | | 537.8 | 0.994 |
| 5 s NH$_3$ plasma, 200 W | N/A | Modified top portion | X | X | 6 | 1.32 |
| | 95% | Filled porosity/baked ULK | | | 596.1 | 0.985 |
| 5 s O$_2$ plasma, 200 W | N/A | Modified top portion | X | X | 8.8 | 1.21 |
| | 87% | Filled porosity/baked ULK | | | 512.6 | 0.976 |

As described herein, once filling material 32 (for example, a thermally labile organic material in solution) is spin-coated on a ULK surface and penetrates its porosity with a subsequent thermal treatment, limited or even no damage may occur to the ULK material during subsequent integration may be formed and/or utilized as well using this technique. In accordance with the steps of FIG. 11A, some of which are described in more detail in reference to the technique of FIG. 1, a structure 20 (as shown, for example, at FIG. 2) is provided including first layer 22 and substrate 24, wherein first layer 22 overlies substrate 24 and includes a dielectric material comprising plurality of pores 26 (110). Structure 20 may be, for example, a semiconductor wafer with an optional interconnect layer deposited thereon top, which is then coated with a first layer 22 (such as an ILD) of a porous ULK material (e.g., an organosilicate). As an example, first layer 22 may be formed of single or dual damascene wiring with a high electrical conductivity material (e.g., copper, aluminum, alloys thereof) embedded in an ILD and optionally capped with a diffusion barrier dielectric (e.g., SiN, NBLOK).

The technique of FIG. 11A further includes using a plasma to modify a top portion of first layer 22 to form a modified top portion 30 of first layer 22 that has a thickness "T" (as shown at FIG. 3), where T is in the range of about 5 to about 20 nanometers (nm). In modifying top portion 30 of first layer 22, plurality of pores 26 remain substantially unsealed (112) (for example, nearly unsealed or entirely unsealed). The disclosed method of FIG. 11A modifies between about 5 and about 20 nm of a top portion of the dielectric material of first layer 22 in a controlled way using the plasma treatment, as discussed in reference to the technique of FIG. 1 and shown, for example, at FIG. 4.

The technique of FIG. 11A further includes applying filling material 32 to modified top portion 30 of first layer 22, where filling material 32 includes a polymer (114), for example as shown by the exemplary structure at FIG. 6. The referenced technique then provides for heating of plasma-treated structure 20 and/or filling material 32 (e.g., an organic polymer) to enable filling material 32 to at least partially (or entirely) fill all or substantially all of plurality of pores 26 disposed throughout first layer 22, under conditions the same as or substantially similar to those recited with respect to the technique of FIG. 1. Upon heating plasma-treated structure 20 and/or filling material 32, filling material 32 fills a larger volume of plurality of pores 26 of first layer 22 as compared to the unheated structure and filling material, and a sufficient amount of filling material 32 is applied so that a residual amount of filling material 32 remains disposed over all of top surface 28 of modified top portion 30 of first layer 22 (116), for example as shown at FIG. 7. The residual amount of filling material 32 that was deposited on top surface 28 of the filled first layer 22 (e.g., an ILD film) is then removed by a suitable method (118), such as plasma etch, RIE strip, wet dissolution or gentle polishing, without removal of the polymer from the filled pores of the structure. A hardmask layer may then be deposited on top of filled first layer 22 (120), for example, using plasma enhanced chemical vapor deposition (PECVD) or spin-on techniques. The hardmask can be formed of a suitable material including, as non-limiting examples, $SiO_2$, $Al_2O_3$, SiN, $Si_3N_4$, SiC, SiCOH or another suitable hardmask material as known in the art. The hardmask layer may further be formed by more than one layer of material, though the total thickness preferably should be less than 250 nm and, more preferably, less than 100 nm.

According to the continued technique of FIG. 11B, a photoresist layer may be applied to the top of the hardmask layer, exposed to generate a desired pattern, developed, and then baked (122), for example, at a temperature of about 200° C. or less. The hardmask layer and the filled first layer 22 (e.g., an ILD layer of ULK material) may be etched (e.g., in a plasma etching process) to remove those regions defined by openings in the photoresist pattern on top of the hardmask layer, creating one or more etched openings in the hardmask layer and first layer 22 (124). Any remnants of the photoresist layer may then be removed (126) by, for example, a strip process. During such a strip process, the porosity of ULK materials (such as organosilicates) not filled with a filling material, in accordance with the technique of FIGS. 11A and 11B, can be exposed to and damaged by the strip process chemistry used to remove the photo-resist layer. Without first filling the pores with a filling material, such an exposure may cause the dielectric constant and leakage current of first layer 22 (for example, an ILD of ULK material) to significantly increase. In contrast, when first layer 22 is in a non-porous, hybrid state enriched in carbon, due to the presence of filling material 32 in the original pores as described herein, little or no damage may occur to filled first layer 22. A liner material may then be deposited to form a liner layer on top of the hardmask layer (128). The liner layer may be comprised of a material such as TaN, TiN, Ti, Ta, or various combinations thereof, as non-limiting examples, for achieving adhesion and diffusion barrier properties. In some example embodiments, a seed layer (e.g., copper) optionally may be deposited on top of the liner layer. The seed layer may be deposited by sputtering, for example, and may be used to facilitate subsequent electroplating.

The aforementioned etched opening can then be filled with a metal (130), such as copper. The metal may be formed by electroplating, for example, and may overfill the opening. After the etched opening is filled with the metal, structure 20 may be planarized (132), for example, by a chemical mechanical polishing (CMP) process, to achieve one or more planar surfaces with a metal inlaid structure. In this CMP step, polishing is performed until all of the excess metal, liner and hardmask on top of the filled first layer 22 is removed, thus exposing at least top surface 28 of filled first layer 22. In furtherance of the technique of FIG. 11B, filling material 32 (e.g., organic polymer) may be removed from plurality of pores 26 of first layer 22 (134), as described in reference to the technique of FIG. 1, for example, by decomposing filling material 32 using a thermal curing or a thermal curing assisted by ultraviolet (UV) irradiation, as non-limiting examples. A cap layer of an insulating material (e.g., silicon carbide, silicon nitride, silicon carbonitride, or combinations thereof) may then be deposited on top of first layer 22 (136) to prevent diffusion of the metal and to protect structure 20, or any electronic device incorporated therein, from mechanical abrasion or other damage. Certain aspects of the techniques of FIGS. 1, 11A and 11B are discussed in additional detail at U.S. Pat. Nos. 8,314,005; 8,492,239; 8541301; and 8,623, 741, the entire contents of which are incorporated by reference herein.

As described above, by filling the pores of an ILD with, for example, an organosilicate, damage to the ILD (e.g., to the pores of the ILD) can be avoided during processing of the structure. Also as noted, potential for damage can stem from the strip process chemistry used to remove the photo-resist layer. Without filling the pores, the dielectric constant and the leakage current of the ILD may be adversely affected (e.g., significantly increased). Filling of plurality of pores 26 of first layer 22 with filling material 32, as described herein, includes heating structure 20 and/or filling material 32 to enable filling material 32 to penetrate into the porous ULK material. However, the temperature at which such a step is performed preferably should remain below the decomposition temperature of the filling material. Unless such filling conditions are properly optimized, homogeneous filling of the porous ULK material may not occur. Inhomogeneous filling of first layer 22 is undesirable, in that such a circumstance may yield a ULK material having regions with different properties throughout its thickness. Such variations can complicate integration processing, causing differences in etch rate leading to uncontrolled etch depth and profile, and differences in resistance to plasma exposure affecting the electrical integrity of the thin-film dielectric material. Such variations can have adverse effects on the properties and/or operation of the final structure. Homogeneous filling of pores with a filling material, as that term is utilized herein, refers to a substantially thorough, complete and uniform filling of the pores. That is, homogeneous filling may result in the filled porous material being substantially uniform in composition and, thus, substantially uniform in properties (for example, nearly or entirely uniform in properties). Accordingly, inhomogeneous filling, caused for example by dewetting as discussed herein, may result in a filled porous material having a non-uniform composition and non-uniform properties. Various examples of the invention have been described. These and other examples are within the scope of the following claims.

The invention claimed is:

1. A method comprising:
providing a structure comprising a first layer and a substrate, wherein the first layer overlies the substrate and includes a dielectric material comprising a plurality of pores;
using a plasma to modify a top portion of the first layer to form a modified top portion of the first layer, wherein the modified top portion has a thickness in the range of about 5 to about 20 nanometers (nm), and wherein the plurality of pores in the first layer remains substantially unsealed after the plasma modification;
applying a filling material to the modified top portion of the first layer, wherein the filling material comprises a polymer; and
after applying the filling material, heating at least one of the plasma-treated structure and the filling material to enable the filling material to at least partially fill all or substantially all of the plurality of pores disposed throughout the first layer, wherein upon heating said at least one of the plasma-treated structure and the filling material a residual amount of the filling material remains disposed over all of a top surface of the modified top portion of the first layer.

2. The method of claim 1, wherein the average diameter of the plurality of pores is greater than 1.5 nm, and the volumetric porosity of the first layer of the structure is greater than 20%.

3. The method of claim 1, wherein the average diameter of the plurality of pores is greater than 1.0 nm, and the volumetric porosity of the first layer of the structure is greater than 15%.

4. The method of claim 1, wherein upon said heating, the filling material fills at least 80% of the volumetric porosity of the first layer of the structure.

5. The method of claim 1, wherein the plasma includes an ionized gas selected from the group consisting of argon, ammonia, carbon monoxide, oxygen, and combinations thereof.

6. The method of claim 1, wherein said using the plasma comprises using the plasma at a power of about 200 watts for about 5 seconds.

7. The method of claim 1, wherein said using the plasma comprises using the plasma at a power between about 100 watts and about 400 watts for about 5 seconds.

8. The method of claim 1, wherein, after said heating, a portion of the first layer underlying the modified top portion and having pores at least partially filled with the filling material has a density between about 1.30 g/cm$^3$ and about 1.40 g/cm$^3$.

9. The method of claim 1, wherein the contact angle of water on the top surface of the modified top portion of the first layer is less than about 50°.

10. The method of claim 1, wherein the filling material possesses at least one characteristic selected from a group consisting of:
a molecular weight that is compatible with the average diameter of the plurality of pores disposed throughout the first layer of the structure to facilitate penetration of the filling material into the plurality of pores;
a low melt viscosity when heated to enable filling of the plurality of pores by capillary action; and
a stability against decomposition during thermal excursions of up to about 300° C. and a decomposability at a temperature between about 300° C. and about 400° C.

11. The method of claim 1, further comprising removing the residual amount of the filling material disposed over the top surface of the modified top portion of the first layer.

12. The method of claim 1, further comprising, after said heating, performing at least one process on the structure.

13. The method of claim 12, further comprising, after performing said at least one process on the structure, performing a dilute hydrofluoric acid (DHF) soak on the structure to dissolve at least some of the modified top portion of the first layer.

14. The method of claim 12, further comprising, after performing said at least one process on the structure, removing the filling material from the plurality of pores of the first layer by heating said at least one of the structure or filling material at a temperature of about 400° C. for about 15 minutes to decompose the filling material.

15. The method of claim 14, wherein, after removing the filling material from the plurality of pores, the first layer of the structure underlying the modified top portion has a density between about 0.970 g/cm$^3$ and about 1.00 g/cm$^3$.

16. The method of claim 1, further comprising:
removing the residual amount of the filling material;
depositing a hardmask layer on the top surface of the modified top portion of the first layer;
applying a photoresist layer on the hardmask layer and patterning the photoresist layer, wherein one or more openings in the patterned photoresist layer expose a portion of the hardmask layer;
etching at least part of the exposed portion of the hardmask layer and the first layer underlying the exposed portion of the hardmask layer to form one or more etched openings in the hardmask and first layers;
removing a remainder of the photoresist layer to expose a remainder of the hardmask layer;
depositing a liner material on at least some of the remainder of the hardmask layer and in the one or more etched openings in the hardmask and first layers to form a liner layer;
filling the one or more etched openings with a metal, wherein the metal overfills the one or more etched openings and is disposed on at least some of the liner layer over the remainder of the hardmask layer;
planarizing at least some of the metal, the liner layer over the remainder of the hardmask layer, and the remainder of the hardmask layer to expose at least some of the top surface of the modified top portion of the first layer;
removing the filling material from the plurality of pores; and
depositing a cap layer of an insulating material on at least the top surface of the modified top portion of the first layer, wherein the first layer comprises a porous ultra low-k (ULK) material.

17. A method comprising:
using a plasma to modify a top portion of a first layer of a structure to form a modified top portion, wherein the first layer includes a dielectric material comprising a plurality of pores, the plurality of pores remaining substantially unsealed after the plasma modification, the modified top portion of the first layer having a thickness in the range of about 5 to about 20 nanometers (nm), and wherein the structure comprises the first layer and a substrate, the first layer overlying the substrate;

applying a filling material to the modified top portion of the first layer, the filling material comprising a polymer; and after applying the filling material, heating at least one of the plasma-treated structure and the filling material to enable the filling material to fill at least 50% of the volumetric porosity defined by the plurality of pores of the first layer, wherein upon heating said at least one of the plasma-treated structure and the filling material, a residual amount of the filling material remains disposed over all of a top surface of the modified top portion of the first layer.

18. The method of claim 17, wherein said heating enables the filling material to fill at least 80% of the volumetric porosity defined by the plurality of pores of the first layer.

19. The method of claim 17, wherein said using the plasma comprises using the plasma at a power of between about 100 watts and about 400 watts.

20. The method of claim 17, wherein the plasma includes an ionized gas selected from the group consisting of argon, ammonia, carbon monoxide, oxygen, and combinations thereof, and wherein said using the plasma comprises using the plasma for about 5 seconds.

* * * * *